US012813083B2

(12) United States Patent

Lee et al.

(10) Patent No.: US 12,813,083 B2

(45) Date of Patent: Nov. 24, 2026

(54) LIGHT EMITTING DISPLAY DEVICE INCLUDING COLOR FILTER HAVING MULTI-WIDTH RECESS PORTIONS AND ELECTRONIC DEVICE INCLUDING THE SAME

(71) Applicant: SAMSUNG DISPLAY CO., LTD., Yongin-si (KR)

(72) Inventors: Jun Hee Lee, Yongin-si (KR); Seong-Yong Hwang, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 365 days.

(21) Appl. No.: 18/419,745

(22) Filed: Jan. 23, 2024

(65) Prior Publication Data

US 2024/0349540 A1 Oct. 17, 2024

(30) Foreign Application Priority Data

Apr. 14, 2023 (KR) ........................ 10-2023-0049304

(51) Int. Cl.

*H10K 59/12* (2023.01)
*H10K 59/122* (2023.01)
*H10K 59/38* (2023.01)
*H10K 59/80* (2023.01)

(52) U.S. Cl.

CPC ........... *H10K 59/122* (2023.02); *H10K 59/38* (2023.02); *H10K 59/873* (2023.02); *H10K 59/8792* (2023.02)

(58) Field of Classification Search

CPC .... H10K 59/122; H10K 59/38; H10K 59/373; H10K 59/8792; H10K 59/8731; H10K 59/879; H10K 59/131; H10K 59/8051; H10K 59/8052; H10K 59/872

See application file for complete search history.

(56) References Cited

U.S. PATENT DOCUMENTS

| | | | | |
|---|---|---|---|---|
| 2006/0139515 A1* | 6/2006 | Baek | G02B 5/201 | 349/106 |
| 2008/0252829 A1* | 10/2008 | Chae | G02F 1/133516 | 349/187 |
| 2012/0088325 A1* | 4/2012 | Fujiyoshi | G02F 1/133516 | 438/30 |

(Continued)

FOREIGN PATENT DOCUMENTS

| | | | | |
|---|---|---|---|---|
| CN | 114639707 A * | 6/2022 | H10K 71/00 |
| JP | 2004045726 A * | 2/2004 | |

(Continued)

*Primary Examiner* — Ida M Soward

(74) *Attorney, Agent, or Firm* — F. CHAU & ASSOCIATES, LLC

(57) ABSTRACT

A light emitting display device includes a substrate. A pixel electrode is disposed on the substrate. A pixel defining layer has an opening overlapping the pixel electrode. A common electrode is disposed on the pixel electrode and the pixel defining layer. An encapsulation layer is disposed on the common electrode. A color filter is disposed on the encapsulation layer. The color filter includes recess portions formed on an upper side, and the recess portions include a first recess portion with a first width and a second recess portion with a second width that is different from the first width.

20 Claims, 16 Drawing Sheets

(56) References Cited

U.S. PATENT DOCUMENTS

| | | | | |
|---|---|---|---|---|
| 2014/0027724 | A1* | 1/2014 | Lim | H10K 59/38 257/40 |
| 2014/0175399 | A1* | 6/2014 | Choi | H10K 59/38 257/40 |
| 2019/0341428 | A1* | 11/2019 | Lee | H10K 59/38 |
| 2020/0119113 | A1* | 4/2020 | Lee | H10K 59/122 |
| 2020/0321401 | A1* | 10/2020 | Ahn | H10W 46/00 |
| 2022/0199690 | A1* | 6/2022 | Lee | H10K 59/38 |
| 2023/0062159 | A1* | 3/2023 | Cho | H10K 59/121 |
| 2024/0172481 | A1 | 5/2024 | Lee | |
| 2024/0215413 | A1 | 6/2024 | Hwang et al. | |

FOREIGN PATENT DOCUMENTS

| | | | | |
|---|---|---|---|---|
| KR | 20040038232 | A * | 5/2004 | G02F 1/133516 |
| KR | 20070110976 | A * | 11/2007 | G02F 1/136209 |
| KR | 20100030865 | A * | 3/2010 | H10K 59/879 |
| KR | 20180082661 | A * | 7/2018 | H10K 59/124 |
| KR | 10-2019-0014140 | | 2/2019 | |
| KR | 10-2014885 | | 8/2019 | |
| KR | 10-2019-0128010 | | 11/2019 | |
| KR | 10-2020-0115790 | | 10/2020 | |
| KR | 10-2024-0073210 | A | 5/2024 | |
| KR | 10-2024-0104270 | A | 7/2024 | |

* cited by examiner

LIGHT EMITTING DISPLAY DEVICE INCLUDING COLOR FILTER HAVING MULTI-WIDTH RECESS PORTIONS AND ELECTRONIC DEVICE INCLUDING THE SAME

CROSS-REFERENCE TO RELATED APPLICATION

This application claims priority under 35 U.S.C. § 119 to Korean Patent Application No. 10-2023-0049304, filed at the Korean Intellectual Property Office on Apr. 14, 2023, the entire contents of which are herein incorporated by reference.

TECHNICAL FIELD

The present disclosure relates to a display device and, more specifically, to a light emitting display device and an electronic device including the same.

DISCUSSION OF THE RELATED ART

A light emitting display device may include light emitting diodes corresponding to pixels, and may display an image by controlling the luminance of each light emitting diode. Unlike a light receiving display device, such as a liquid crystal display, the light emitting display device does not require a separate light source such as a backlight, and thus the thickness and weight of the light emitting display device may be reduced. In addition, the light emitting display device has characteristics such as high luminance, a high contrast ratio, high color reproduction, and a high response rate, and thus it may display high-quality images.

Accordingly, light emitting display devices have been applied to various electronic devices for example, mobile devices such as smart phones, tablet computers, or laptop/notebook computers, computer monitors, and televisions.

SUMMARY

A light emitting display device includes a substrate. A pixel electrode is disposed on the substrate. A pixel defining layer has an opening overlapping the pixel electrode. A common electrode is disposed on both the pixel electrode and the pixel defining layer. An encapsulation layer is disposed on the common electrode. A color filter is disposed on the encapsulation layer. The color filter includes recess portions formed in an upper side thereof, and the recess portions include a first recess portion having a first width and a second recess portion having a second width that is different from the first width.

The first width may be within a range of 5 μm to 7 μm, and the second width may be within a range of 2 μm to 4 μm.

The first recess portion and the second recess portion may each have a depth within a range of 0.2 μm to 0.8 μm.

The first recess portion may have less curvature than the second recess portion.

The recess portions may be formed in a region overlapping at least the opening.

The color filter may include a first color filter and a second color filter that are adjacent to each other. Edge portions of the first color filter and the second color filter may overlap each other to form an overlapping portion. The recess portions may include a recess portion disposed in an upper side of the overlapping portion.

The light emitting display device may further include an overcoat layer disposed on the color filter, and a light blocker disposed between the color filter and the overcoat layer and having an opening overlapping the opening of the pixel defining layer.

The light blocker may include a recess portion formed in the upper side thereof.

The recess portions may further include a third recess portion having a third width that is different from each of the first width and the second width.

The first width may be within a range of 5 μm to 7 μm, the second width may be within a range of 2 μm to 4 μm, and the third width may be within a range of 0.5 μm to 1.5 μm.

The light emitting display device may further include an overcoat layer disposed on the color filter.

A refractive index difference between the color filter and the overcoat layer may be 0.05 or more.

The light emitting display device may further include a light blocker disposed between the encapsulation layer and the color filter and having an opening overlapping the opening of the pixel defining layer. The recess portions may be formed in a region overlapping the opening of the light blocker on the color filter.

At least some of the recess portions may contact each other.

Each of the recess portions may have a dimple shape.

An electronic device includes a housing. A cover window is disposed on the housing. A display panel is disposed between the housing and the cover window. The display panel includes a substrate, a pixel electrode disposed on the substrate, a pixel defining layer having an opening overlapping the pixel electrode, a common electrode disposed on the pixel electrode and the pixel defining layer. An encapsulation layer is disposed on the common electrode. A color filter is disposed on the encapsulation layer. The color filter includes recess portions formed on the upper side thereof. The recess portions include a first recess portion having a first width and a second recess portion having a second width that is different from the first width.

The first width may be within a range from 5 μm to 7 μm, and the second width may be within a range from 2 μm to 4 μm. The first recess portion and the second recess portion may each have a depth within a range of 0.2 μm to 0.8 μm.

The display panel may further include a light blocker disposed between the encapsulation layer and the color filter, and including an opening overlapping the opening of the pixel defining layer. The recess portions may be formed in a region overlapping the opening of the light blocker on the color filter.

The color filter may include a first color filter and second color filter that are adjacent to each other. Edge portions of the first color filter and the second color filter may overlap each other to form an overlapping portion. The recess portions may include an overlapping recess portion disposed on an upper side of the overlapping portion.

The display panel may further include an overcoat layer disposed on the color filter and a light blocker disposed between the color filter and the overcoat layer, and including an opening overlapping the opening of the pixel defining layer. The light blocker may include a recess portion formed on an upper side thereof.

The recess portions may further include a third recess portion having a third width that is less than the second width.

The display panel may further include an overcoat layer disposed on the color filter.

A refractive index difference between the color filter and the overcoat layer may be 0.05 or more.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

The present disclosure will be described more fully hereinafter with reference to the accompanying drawings, in which embodiments of the disclosure are shown.

It should be understood that when an element such as a layer, film, region, or substrate is referred to as being "on" another element, it can be directly on the other element, or intervening elements may also be present. In contrast, when an element is referred to as being "directly on" another element, there are no intervening elements present.

Unless explicitly stated to the contrary, the word "comprise," and variations such as "comprises," "comprising," or "including" will be understood to imply the inclusion of stated elements but not the exclusion of any other elements.

Throughout the specification, when it is stated that a part is "connected (in contact with, coupled)" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

The terms "DR1," "DR2," and "DR3" are used for indicating directions, and "DR1" is a first direction, "DR2" is a second direction that is vertical to the first direction, and "DR3" is a third direction that is vertical to the first direction and the second direction.

Figure 1:
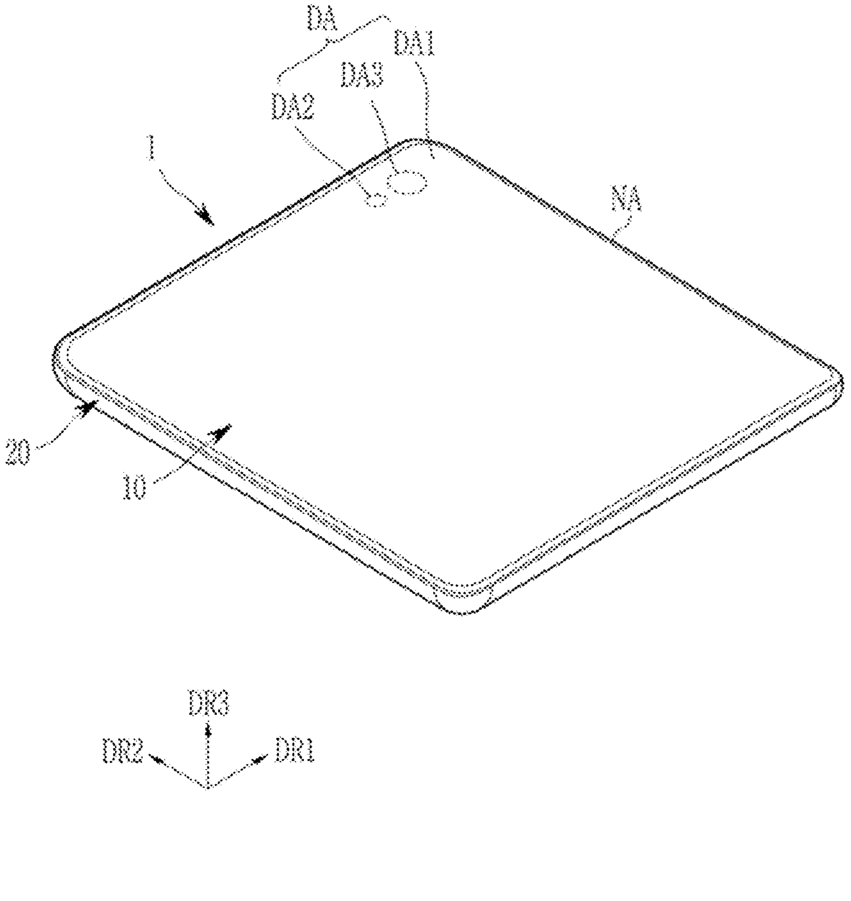
FIG. 1 is a perspective view of an electronic device according to an embodiment.
Figure 2:
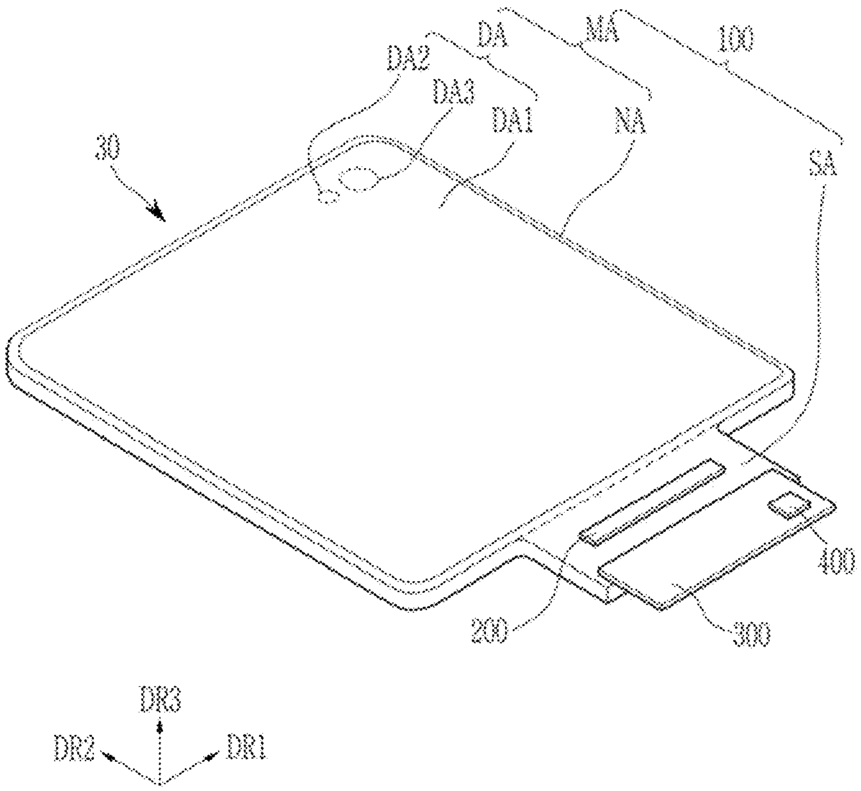
FIG. 2 is a perspective view of a light emitting display device included in an electronic device according to an embodiment.
Figure 3:
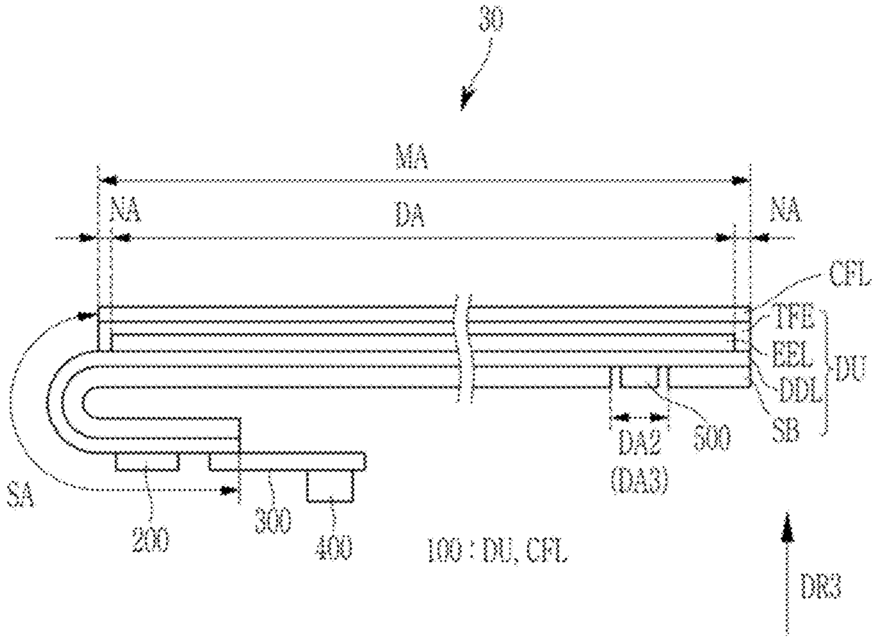
FIG. 3 is a side view of a light emitting display device of FIG. 2.

FIG. 1 is a perspective view of an electronic device according to an embodiment, FIG. 2 is a perspective view of a light emitting display device included in an electronic device according to an embodiment, and FIG. 3 is a side view of a light emitting display device of FIG. 2.

Referring to FIG. 1, FIG. 2, and FIG. 3, the electronic device 1 may include a display screen for displaying images in the third direction DR3 that corresponds to the front, in a plan view, defined by the first direction DR1 and the second direction DR2. For example, the electronic device 1 may include televisions, laptop computers, computer monitors, digital billboards, mobile phones, smartphones, tablet computers, electronic watches, smartwatches, watch phones, head-mounted displays (HMDs), mobile communication terminals, electronic notebooks, electronic books, portable multimedia players (PMPs), global positioning system (GPS) navigation devices, game consoles, digital cameras, and camcorders.

The electronic device 1 may include a cover window 10, a housing 20, and a display device 30.

The cover window 10 may include an insulating panel. For example, the cover window 10 may include glass, plastic, or combinations thereof. The front side of the cover window 10 may define a front side of the electronic device 1. A region that corresponds to a display screen in the cover window 10 may be optically transparent to visible light. The cover window 10 may be disposed on the display device 30 to protect the display device 30 from external impacts, and may transmit the image displayed by the display device 30 therethrough.

The housing 20 may be made of a material with relatively high rigidity. For example, the housing 20 may include glass, plastic, or metal, or may include frames and/or plates made of combinations thereof. The housing 20 may be combined with the cover window 10, and the combined housing 20 and the cover window 10 may constitute an exterior of the electronic device 1 and may provide an internal space for the electronic device 1. For example, the housing 20 may constitute rear and side surfaces of the electronic device 1, and the cover window 10 may constitute the front side of electronic device 1. The display device 30 may be positioned in the inner space limited by the cover window 10 and the housing 20, and the display device 30 may be thereby protected from external environments.

The display device 30 may display images and may provide a displaying screen of the electronic device 1. The display device 30 may be a light emitting display device such as an organic light emitting diode (OLED) device, an inorganic light emitting display device, or a quantum dot light emitting display device.

The electronic device 1 may have various shapes. For example, as shown in FIG. 1, the electronic device 1 may be a quadrilateral with round corners, as seen from the front. In addition to this, the electronic device 1 may have a shape such as a rectangle, a square, other polygons, a circle, or an oval.

Each of the electronic device 1 and the display device 30 may include a display area DA and a non-display area NA.

The display area DA and the non-display area NA shown in FIG. 1 may correspond to the display area DA and the non-display area NA of the display device 30 shown in FIG. 2 and FIG. 3. The display area DA may correspond to the displaying screen as an image displaying region. The non-display area NA displays no images. The display area DA may occupy most of the region on the front side of the electronic device 1, and the non-display area NA may at least partially surround the display area DA.

The display area DA may include a first display area DA1, a second display area DA2, and a third display area DA3. The second display area DA2 and the third display area DA3 may represent regions below which components such as sensors or cameras for providing various functions to the electronic device 1 are disposed. The second display area DA2 and the third display area DA3 may correspond to component regions. The second display area DA2 and the third display area DA3 may be at least partially surrounded by the first display area DA1. The second display area DA2 and the third display area DA3 in addition to the first display area DA1 may display images. Positions and numbers of the second display area DA2 and the third display area DA3 are modifiable in many ways without departing from the spirit or scope of the present disclosure.

In further detail of the display device 30, the display device 30 may allow the electronic device 1 to provide a displaying screen. The display device 30 may sense or photograph the front side of the electronic device 1. The display device 30 may have a planar shape that is similar to the electronic device 1.

The display device 30 may include a display panel 100, a displaying driver 200, a printed circuit board 300, and a touch driver 400.

The display panel 100 may include a main area MA and a sub-area SA.

The main area MA may include a display area DA in which pixels for displaying images are disposed, and a non-display area NA at least partially surrounding the display area DA. The display area DA may include a first display area DA1, a second display area DA2, and a third display area DA3. Components such as sensors or cameras may be disposed on rear sides of the second display area DA2 and the third display area DA3, and the second display area DA2 and the third display area DA3 may correspond to the component region.

The display area DA may discharge light in the third direction DR3 from the light emitting regions that correspond to the light emitting elements. For example, the display panel 100 may include a pixel circuit including transistors, signal lines (e.g., gate lines, data lines, and voltage lines) connected to the pixel circuit, and a light emitting element connected to the pixel circuit. The display panel 100 may include a pixel defining layer having an opening for defining light emitting regions of the respective light emitting elements. The light emitting element may include an organic light emitting diode (OLED) including an organic emission layer, a quantum dot light emitting diode including a quantum dot emission layer, an inorganic light emitting diode including an inorganic semiconductor, and/or a micro light emitting diode.

The non-display area NA may at least partially surround the display area DA. The non-display area NA may be defined to be an edge region of the main area MA of the display panel 100. Circuits and/or signal lines for generating and/or transmitting various signals applied to the display area DA may be disposed in the non-display area NA. For example, a gate driver for supplying gate signals to the gate lines, and fan-out lines for connecting the displaying driver 200 and the signal lines of the display area DA may be disposed in the non-display area NA.

The sub-area SA may extend from one side of the main area MA. The sub-area SA may include a flexible region that is bent, folded, or rolled to a noticeable degree without cracking or otherwise sustaining damage. For example, the sub-area SA may be bent to overlap the main area MA in the thickness direction (e.g., third direction DR3). The displaying driver 200 may be disposed in the sub-area SA, and the pad region may be disposed on the edge. The printed circuit board 300 may be connected to the pad region.

In an embodiment, the sub-area SA may be omitted, and the displaying driver 200 and the pad region may be disposed in the non-display area NA.

The displaying driver 200 may output signals and voltages for driving the display panel 100. The displaying driver 200 may supply data voltages to the data lines. The displaying driver 200 may supply a power voltage to the power supplying lines, and may supply gate control signals to the gate driver. The displaying driver 200 may be formed into an integrated circuit chip and may be mounted on the display panel 100. For example, the displaying driver 200 may be disposed in the sub-area SA, and may overlap the main area MA in the thickness direction (e.g., third direction; DR3) by bending the sub-area SA. In an embodiment, the displaying driver 200 may be mounted on the printed circuit board 300.

The printed circuit board 300 may be bonded to the pad region of the display panel 100 by using an anisotropic conductive film. The lead lines of the printed circuit board 300 may be electrically connected to the pads of the pad region of the display panel 100. The printed circuit board 300 may be flexible.

The touch driver 400 may be mounted on the printed circuit board 300. The touch driver 400 may be electrically connected to a touch sensor included in the electronic device 1. The touch sensor may be provided to the display area DA of the display panel 100. The touch driver 400 may supply touch driving signals to sensing electrodes of the touch sensor, and may sense variance of capacitance among the sensing electrodes. For example, the touch driving signal may be a pulse signal with a predetermined frequency. The touch driver 400 may calculate a touching state and a touch coordinate based on the variance of capacitance among the sensing electrodes. The touch driver 400 may be provided as an integrated circuit chip.

Referring to FIG. 3, the display panel 100 may include a display unit DU and an external light reducing layer CFL. The display unit DU may include a substrate SB, a driving device layer DDL, a light emitting element layer EEL, and an encapsulation layer TFE.

The substrate SB may be a base substrate or a base layer. The substrate SB may be a flexible substrate including a polymer resin such as a polyimide, a polyamide, or a polyethylene terephthalate. The substrate SB may be a rigid substrate made of a material such as glass.

The driving device layer DDL may be disposed on the substrate SB. The driving device layer DDL may include transistors and capacitors configuring pixel circuits for outputting driving currents to the light emitting elements. The driving device layer DDL may include gate lines, data lines, power supplying lines, gate control lines, fan-out lines for connecting the displaying driver 200 and the data lines, and lead lines for connecting the displaying driver 200 and displaying pads of the pad region. The driving device layer DDL may include transistors and capacitors configuring the gate driver, and gate control lines. The driving device layer DDL may include conductive layers, semiconductor layers, and insulating layers, and may insulate the transistors, the capacitors, and the signal lines.

The light emitting element layer EEL may be disposed on the driving device layer DDL, and may include light emitting elements and light emitting regions corresponding to the same. The light emitting element layer EEL may include a pixel defining layer having an opening for defining light emitting regions.

The encapsulation layer TFE (or a thin film encapsulation layer) may cover an upper side and a lateral side of the light emitting element layer EEL, and may prevent permeation of ambient moisture or oxygen into the light emitting element layer EEL. The encapsulation layer TFE may include at least one inorganic layer and at least one organic layer.

The external light reducing layer CFL may be disposed on the encapsulation layer TFE, and may include color filters corresponding to the respective light emitting regions. Further, the external light reducing layer CFL may include a light blocker disposed between the adjacent color filters or in a region in which the adjacent color filters overlap each other. The light blocker may be disposed above, below, and/or on the color filters. The external light reducing layer CFL may be formed on the encapsulation layer TFE. Regarding the external light reducing layer CFL, the color filters may transmit light with a specific wavelength and may block or absorb light with other wavelengths, and the light blocker may absorb external light. Accordingly, an amount of ambient light input into the light emitting display device 30 from the outside may be reduced, and an amount of light reflected by the light emitting display device 30 may be reduced, thereby reducing drawbacks caused by the reflection of external light. As the external light reducing layer CFL may function as a conventional polarization layer used as a reflection reducing layer, the light emitting display device 30 might not include a polarization layer, and hence, a thickness of the light emitting display device 30 may be reduced, light-outputting efficiency of the light emitting display device 30 may be increased, and power consumption may be reduced.

The light emitting display device 30 may further include an optical device 500. The optical device 500 may be disposed on a rear side of the second display area DA2 or the third display area DA3. The optical device 500 may output or receive infrared rays, ultraviolet rays and/or light in the visible ray band. For example, the optical device 500 may be an optical sensor for sensing light input to the light emitting display device 30 such as a proximity sensor, an illuminance sensor, a camera sensor, or an image sensor.

Figure 4:
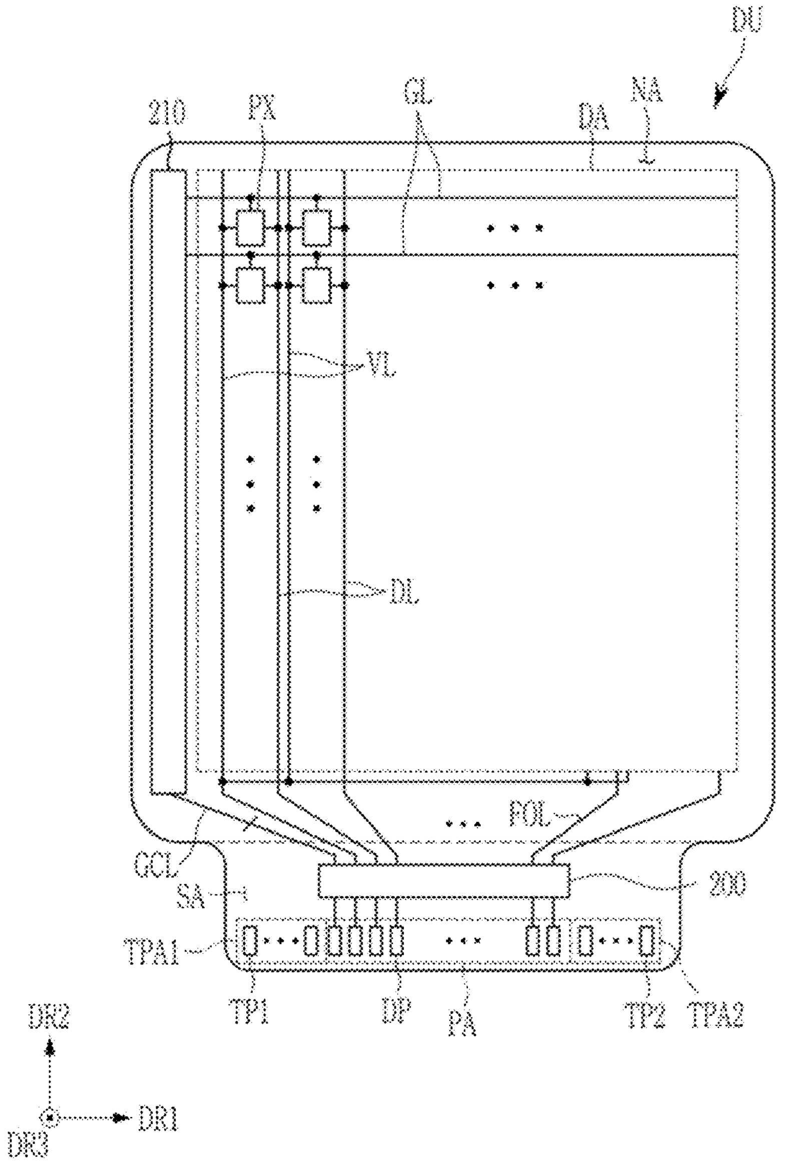
FIG. 4 is a top plan view of a connection relationship among constituent elements of a light emitting display device according to an embodiment.

FIG. 4 is a top plan view of a connection relationship among constituent elements of a light emitting display device according to an embodiment.

Referring to FIG. 4, the display unit DU of the light emitting display device 30 may include a display area DA and a non-display area NA.

The display area DA may be disposed in the center of the display panel 100. Unit pixels PX, gate lines GL, data lines DL, and power supplying lines VL may be disposed in the display area DA. The respective unit pixels PX may include, as a minimum unit for emitting light, a pixel circuit including a transistor and a capacitor, and a light emitting element for receiving a driving current from the pixel circuit. The unit pixel PX may be connected to the gate line GL, the data line DL, and the power supplying line VL.

The gate lines GL may supply the gate signal applied by the gate driver 210 to the unit pixels PX. The gate lines GL may extend in the first direction DR1 and may be spaced apart from each other in the second direction DR2.

The data lines DL may supply the data voltage applied by the displaying driver 200 to the unit pixels PX. The data lines DL may extend in the second direction DR2 and may be spaced apart from each other in the first direction DR1.

The power supplying lines VL may supply power voltages applied by the displaying driver 200 to the unit pixels PX. The power voltages may include a high-potential power voltage (or a driving voltage), a low-potential power voltage (or a common voltage), and an initialization voltage, and the power voltages may be transmitted to the unit pixel PX. The power supplying lines VL may extend in the second direction DR2 and may be spaced apart from each other in the first direction DR1.

The non-display area NA may at least partially surround the display area DA. A gate driver 210, fan-out lines FOL, and gate control lines GCL may be disposed in the non-display area NA. The gate driver 210 may generate gate signals based on gate control signals, and may supply gate signals to the gate lines GL in predetermined order. The fan-out lines FOL may extend to the display area DA from the displaying driver 200. The fan-out lines FOL may transmit the data voltages output by the displaying driver 200 to the data lines DL. The gate control lines GCL may extend to the gate driver 210 from the displaying driver 200. The gate control lines GCL may transmit the gate control signals output by the displaying driver 200 to the gate driver 210.

The light emitting display device 30 may include a sub-area SA. The sub-area SA may include a displaying driver 200, a pad region PA, a first touch pad region TPA1, and a second touch pad region TPA2.

The displaying driver 200 may output signals and voltages for driving the display panel 100. The displaying driver 200 may supply the data voltages to the data lines DL through the fan-out lines FOL. The data voltages may be supplied to the unit pixels PX, and may control luminance of the unit pixels PX. The displaying driver 200 may supply gate control signals to the gate driver 210 through the gate control lines GCL.

The pad region PA, the first touch pad region TPA1, and the second touch pad region TPA2 may be disposed on an edge of the sub-area SA. The displaying pads DP may be disposed in the pad region PA. The displaying pads DP may be connected to a graphic system through the printed circuit board 300. The displaying pads DP may be connected to the printed circuit board 300 to receive digital video data, and may supply the digital video data to the displaying driver 200. Touch pads TP1 and TP2 may be disposed in the first touch pad region TPA1 and the second touch pad region TPA2, and the touch pads TP1 and TP2 may be connected to the touch electrodes of the touch sensor and the touch driver 400 disposed on the printed circuit board 300 to sense touches. The pad region PA, the first touch pad region TPA1, and the second touch pad region TPA2 may be electrically connected to the printed circuit board 300 by an anisotropic conductive film or a self-assembly anisotropic conductive paste (SAP).

Figure 5:
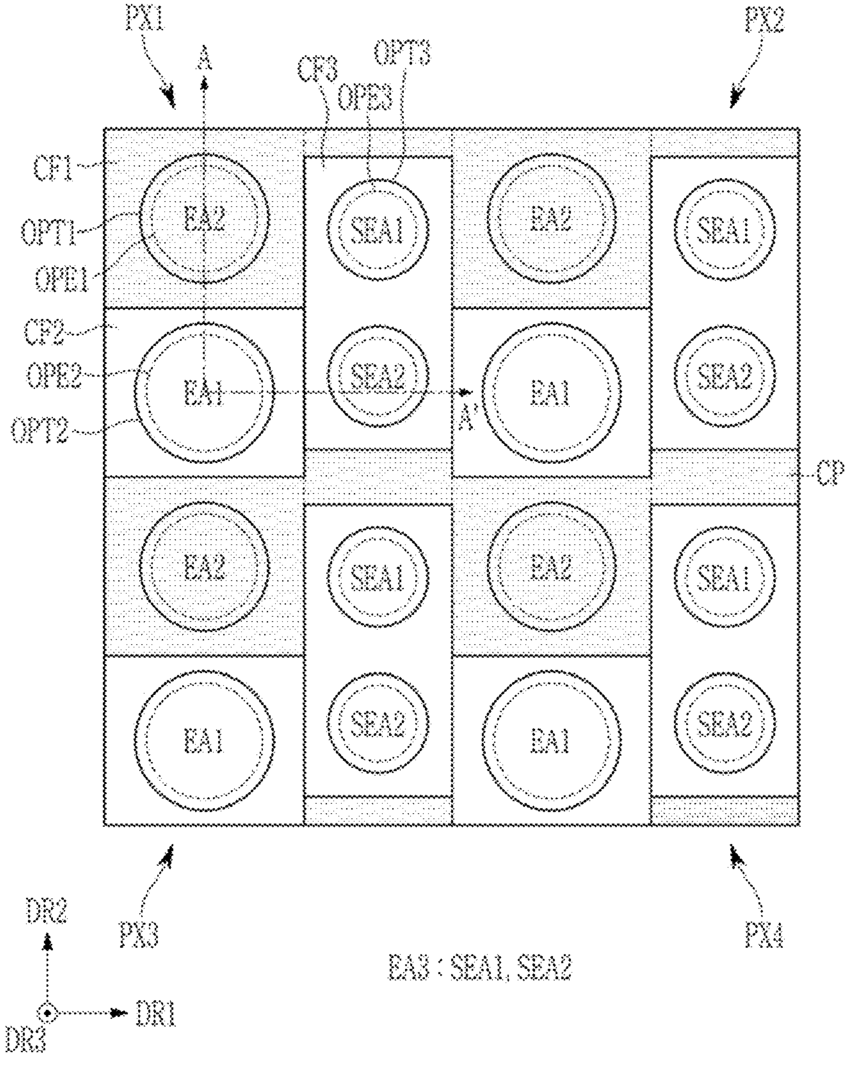
FIG. 5 is a top plan view of disposition of a light emitting region, a color filter, and a light blocker in a display area of a light emitting display device according to an embodiment.
Figure 6:
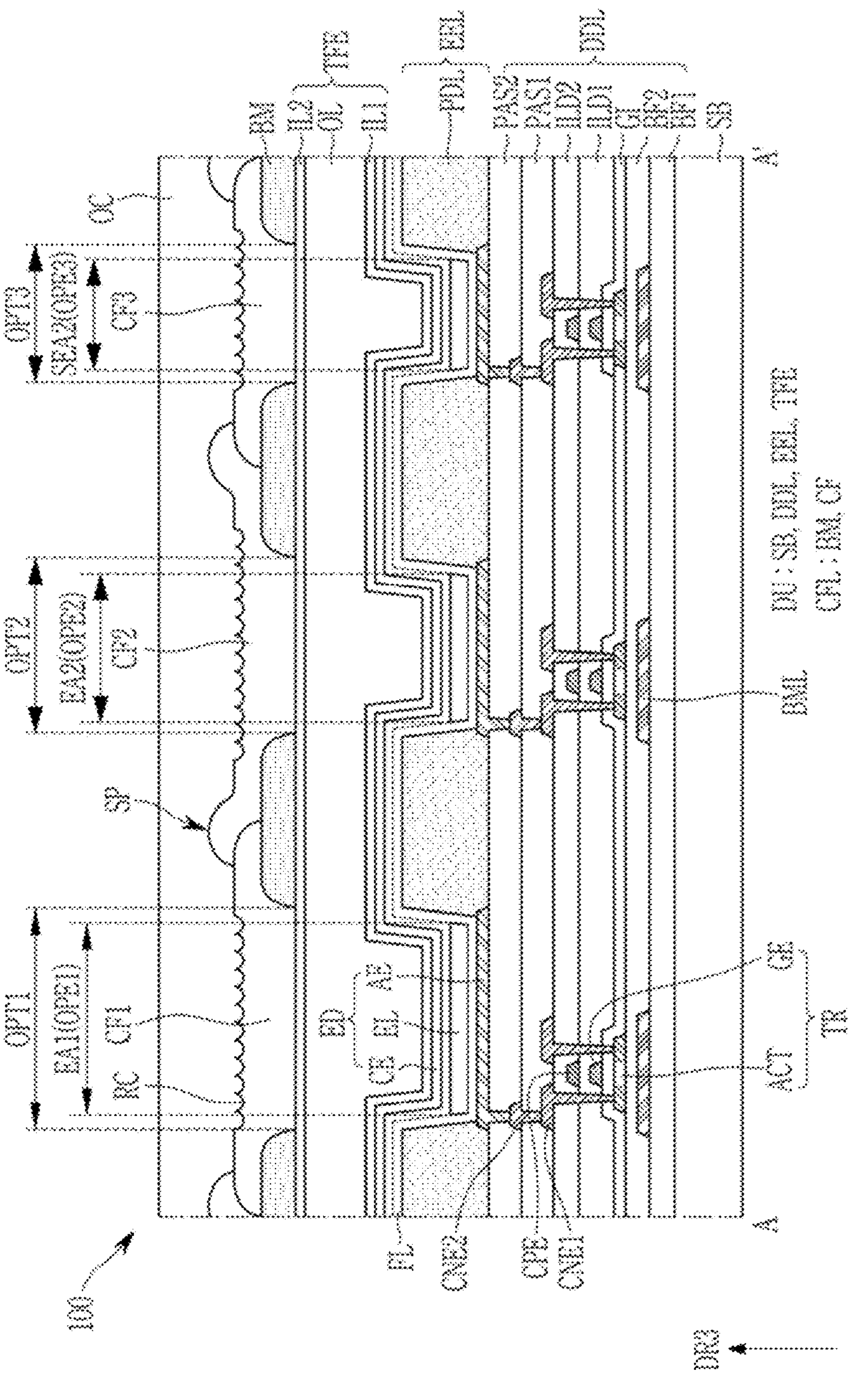
FIG. 6 is a cross-sectional view with respect to a line A-A' of FIG. 5.
Figure 7:
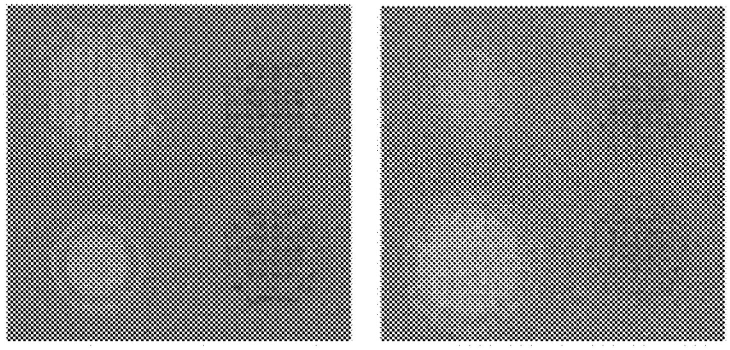
FIG. 7 includes images illustrating reflecting characteristics of a light emitting display device according to an embodiment.

FIG. 5 is a top plan view of disposition of a light emitting region, a color filter, and a light blocker in a display area of a light emitting display device according to an embodiment, and FIG. 6 is a cross-sectional view with respect to a line A-A' of FIG. 5. FIG. 7 includes images illustrating reflecting characteristics of a light emitting display device according to an embodiment.

Referring to FIG. 5 and FIG. 6, openings OPE1, OPE2, and OPE3 of the pixel defining layer and openings OPT1, OPT2, and OPT3 of the light blocker BM may have circular shapes in a plan view. Light reflected by the circular shape in a plan view might not have a specific direction and may be reflected to thereby prevent reflected light from focusing in a specific direction and prevent the reflected light from being easily visible. The color filters CF1, CF2, and CF3 are divided by straight lines in FIG. 5.

The light emitting display device 30 may include unit pixels PX1, PX2, PX3, and PX4 disposed in the display area DA and light emitting regions EA1, EA2, and EA3 disposed in the unit pixels PX1, PX2, PX3, and PX4. The unit pixels PX1, PX2, PX3, and PX4 may include light emitting regions EA1, EA2, and EA3 for displaying different colors and may be arranged in the first direction DR1 and the second direction DR2. The first unit pixel PX1 and the second unit pixel PX2 may be near each other in the first direction DR1, and the first unit pixel PX1 and the third unit pixel PX3 may be near each other in the second direction DR2. The third unit pixel PX3 and the fourth unit pixel PX4 may be near each other in the first direction DR1, and the second unit pixel PX2 and the fourth unit pixel PX4 may be near each other in the second direction DR2. However, the unit pixels PX1, PX2, PX3, and PX4 may be disposed in many ways different. For example, the unit pixels PX1, PX2, PX3, and PX4 may be disposed in a PENTILE™ type or a diamond PENTILE™ type, where PENTILE™ is an arrangement of luminous areas manufactured by SAMSUNG.

The light emitting regions EA1, EA2, and EA3 of the respective unit pixels PX1, PX2, PX3, and PX4 may include a first light emitting region EA1, a second light emitting region EA2, and a third light emitting region EA3 for emitting light with different colors. The third light emitting region EA3 may include a first sub-light emitting region SEA1 and second sub-light emitting region SEA2 spaced in the second direction DR2. The first sub-light emitting region SEA1 and the second sub-light emitting region SEA2 are separated, but they may emit light with the same color and may constitute the third light emitting region EA3.

The first, second and third light emitting regions EA1, EA2, and EA3 may emit one of red, green, and blue light. For example, the first light emitting region EA1 may emit red light, the second light emitting region EA2 may emit green light, and the third light emitting region EA3 may emit blue light. For example, the first light emitting region EA1 may emit red light, the second light emitting region EA2 may emit blue light, and the third light emitting region EA3 may emit green light.

Each of the first light emitting region EA1, the second light emitting region EA2, the first sub-light emitting region SEA2, and the second sub-light emitting region SEA2 may have a circular shape in a plan view, or may have a planar shape that is similar to an oval or a circle. The light emitting regions EA1, EA2, and EA3 may have planar shapes without angulated portions to thus enhance reflecting characteristics.

Regarding the respective unit pixels PX1, PX2, PX3, and PX4, the light emitting regions EA1, EA2, and EA3 may be disposed in the first direction DR1 and the second direction DR2. For example, as shown, the first light emitting region EA1 and the second light emitting region EA2 may be spaced apart from each other in the second direction DR2. The third light emitting region EA3 may be spaced apart from the first and second light emitting regions EA1 and EA2 in the first direction DR1. In the entire display area DA, the first light emitting region EA1 and the second light emitting region EA2 may be alternately disposed in the second direction DR2, and the first sub-light emitting region SEA1 and the second sub-light emitting region SEA2 may be alternately disposed in the second direction DR2. The light emitting regions EA1, EA2, and EA3 may be disposed in many ways. For example, the light emitting regions EA1, EA2, and EA3 may be disposed in the PENTILE™ type or the diamond PENTILE™ type. A color pattern CP may be disposed on both sides of the third light emitting region EA3 in the second direction DR2. The color pattern CP may be a portion protruding in the first direction DR1 of the first color filter CF1.

The light emitting regions EA1, EA2, and EA3 may be defined by the openings OPE1, OPE2, and OPE3, respectively, formed by the pixel defining layer PDL of the light emitting element layer EEL. For example, the first light emitting region EA1 may be defined by the first opening OPE1, the second light emitting region EA2 may be defined by the second opening OPE2, and the third light emitting region EA3 may be defined by the third opening OPE3. Areas or sizes of the light emitting regions EA1, EA2, and EA3 may be different from each other. In an embodiment of FIG. 5, the area of the first light emitting region EA1 may be greater than the area of the second light emitting region EA2, and the area of the second light emitting region EA2 may be greater than the areas of the sub-light emitting regions SEA1 and SEA2. The first sub-light emitting region SEA1 may have the same area as the second sub-light emitting region SEA2. The light emitting regions EA1, EA2, and EA3 may have different areas according to the sizes of the openings OPE1, OPE2, and OPE3 of the pixel defining layer PDL. The amount of light emitted by the light emitting regions EA1, EA2, and EA3 may be different according to the areas of the corresponding light emitting regions EA1, EA2, and EA3, and color impressions of the images displayed by the light emitting display device 30 or the electronic device 1 may be controlled by adjusting the areas of the light emitting regions EA1, EA2, and EA3. The areas of the light emitting regions EA1, EA2, and EA3 may relate to light efficiency and the lifespan of the light emitting element ED and may have a trade-off relationship with the reflection by external light.

The areas of the light emitting regions EA1, EA2, and EA3 may be adjustable by considering the above-noted items. In the light emitting display device 30, the areas of the light emitting regions EA1, EA2, and EA3 or the areas of the openings OPE1, OPE2, and OPE3 of the pixel defining layer PDL may be designed so that reflected external light may be recognized as mixed white light.

The light emitting display device 30 may include color filters CF1, CF2, and CF3 disposed in the light emitting regions EA1, EA2, and EA3. The color filters CF1, CF2, and CF3 may be disposed corresponding to the light emitting regions EA1, EA2, and EA3 or the openings OPE1, OPE2, and OPE3. The color filters CF1, CF2, and CF3 may include a first color filter CF1 overlapping the first light emitting region EA1, a second color filter CF2 overlapping the second light emitting region EA2, and a third color filter CF3 overlapping the third light emitting region EA3. The color filters CF1, CF2, and CF3 may have a greater area than the openings OPE1, OPE2, and OPE3, respectively, of the pixel defining layer PDL. The color filters CF1, CF2, and CF3 may include a colorant, such as a dye or a pigment, for absorbing light with a wavelength that is not the light with a specific wavelength, and they may be disposed corresponding to the color of light emitted by the light emitting regions EA1, EA2, and EA3. For example, the first color filter CF1 may be a red color filter for transmitting red light, the second color filter CF2 may be a green color filter for transmitting green light, and the third color filter CF3 may be a blue color filter for transmitting blue light.

Similar to disposition of the light emitting regions EA1, EA2, and EA3, the color filters CF1, CF2, and CF3 may be disposed in the first direction DR1 and the second direction DR2. For example, the first color filter CF1 and the second color filter CF2 may be adjacently disposed in the second direction DR2, and the third color filter CF3 may be disposed near the first and second color filters CF1 and CF2 in the first direction DR1. A border of the adjacent color filters CF1, CF2, and CF3 is shown with a straight line in FIG. 5, and regarding the adjacent color filters CF1, CF2, and CF3, edge portions may overlap each other to form an overlapping portion SP as shown in FIG. 6. Referring to FIG. 6, the overlapping portion SP of the color filters CF1, CF2, and CF3 may be relatively high, and steps may be formed between the overlapping portion SP and non-overlapping portions of the color filters CF1, CF2, and CF3. As the color filters CF1, CF2, and CF3 to overlap each other, intensity of reflected light caused by external light may be reduced. The color impressions of reflected light caused by external light may be controlled by adjusting the disposition, shapes, and areas of the color filters CF1, CF2, and CF3.

The light emitting display device 30 may include a color pattern CP protruding in the first direction DR1 from the first color filter CF1, contacting the third color filter CF3 in the second direction DR2. The color pattern CP may include the same material as the first color filter CF1 and may be integrally formed with the first color filter CF1. The color pattern CP may consider the color impressions of the light reflected from the light emitting display device 30, may include the same material as the first color filter CF1, and may be disposed in the respective unit pixels PX1, PX2, PX3, and PX4. The color pattern CP may be disposed near the third color filter CF3 in the second direction DR2, and the position on which the color pattern CP is disposed may be different for the unit pixels PX1, PX2, PX3, and PX4, respectively. For example, the color pattern CP may be disposed on an upper side that is one side of the third color filter CF3 in the second direction DR2 on the first unit pixel PX1 and the fourth unit pixel PX4, and the color pattern CP may be disposed on a lower side that is another side of the third color filter CF3 in the second direction DR2 on the second unit pixel PX2 and the third unit pixel PX3. The color pattern CP may be disposed on two of the unit pixels PX1, PX2, PX3, and PX4 that are adjacent in the second direction DR2. The color pattern CP may be spaced and disposed in the second direction DR2 in the entire display area DA.

The light emitting regions EA1, EA2, and EA3 may have different areas, and the color filters CF1, CF2, and CF3 may have different areas. The light emitting regions EA1, EA2, and EA3 may have areas according to specific ratios, and the color filters CF1, CF2, and CF3 may similarly have areas according to specific ratios. However, an area ratio among the light emitting regions EA1, EA2, and EA3 may be different from an area ratio among the color filters CF1, CF2, and CF3. The relative area ratio of the color filters CF1, CF2, and CF3 may give an influence to the color impressions of the reflected external light when the external light is reflected to the light emitting display device 30. The color filters CF1, CF2, and CF3 have areas with specific ratios, and the light emitting display device 30 includes the color pattern CP including the same material as the red color filter so a user may feel that the color impression of the external light is comfortable. The color filters CF1, CF2, and CF3 may be disposed in many ways. For example, the color filters CF1, CF2, and CF3 may be disposed in the PENTILE™ type or the diamond PENTILE™ type.

The light emitting display device 30 may include a light blocker BM disposed between the light emitting regions EA1, EA2, and EA3 and the color filters CF1, CF2, and CF3. The light blocker BM include openings OPT1, OPT2, and OPT3. The openings OPT1, OPT2, and OPT3 of the light blocker BM may overlap the openings OPE1, OPE2, and OPE3 of the pixel defining layer PDL that corresponds to the light emitting regions EA1, EA2, and EA3, and may form a light outputting region for outputting light emitted by the light emitting regions EA1, EA2, and EA3.

The color filters CF1, CF2, and CF3 may have a greater area than the openings OPT1, OPT2, and OPT3, respectively, of the light blocker BM and the corresponding openings OPE1, OPE2, and OPE3 of the pixel defining layer PDL, and may completely cover the corresponding light outputting region.

For example, to a cross-sectional structure of the light emitting display device 30 with reference to FIG. 6, the display panel 100 of the light emitting display device 30 may include a display unit DU and an external light reducing layer CFL. The display unit DU may include a substrate SB, a driving device layer DDL, a light emitting element layer EEL, and an encapsulation layer TFE. The external light reducing layer CFL disposed on the encapsulation layer TFE may include a light blocker BM, color filters CF1, CF2, and CF3, and an overcoat layer OC.

The substrate SB may be a flexible or rigid substrate. The substrate SB may include at least one polymer layer and at least one barrier layer.

The barrier layer may include an inorganic insulating material such as a silicon nitride ($SiN_x$), a silicon nitride ($SiO_x$), a silicon oxynitride ($SiO_xN_y$), etc., and may prevent permeation of ambient moisture or oxygen.

The driving device layer DDL may include a first buffer layer BF1, a bottom metal layer BML, a second buffer layer BF2, a transistor TR, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SB, the bottom metal layer BML may be disposed on the first buffer layer BF1, and the second buffer layer BF2 may cover the bottom metal layer BML.

The transistor TR may be disposed on the second buffer layer BF2. The transistor TR may be a driving transistor or a switching transistor of the pixel circuit. The transistor TR may include a semiconductor layer ACT and a gate electrode GE.

The semiconductor layer ACT may be disposed on the second buffer layer BF2. The semiconductor layer ACT may be disposed on the bottom metal layer BML. The semiconductor layer ACT may include a first region, a second region, and a channel region between the first and second regions. The semiconductor layer ACT may include a semiconductor material such as an oxide semiconductor, amorphous silicon, or polysilicon. For example, the semiconductor layer ACT may include a low temperature polysilicon (LTPS) or may include an oxide semiconductor material including zinc (Zn), indium (In), gallium (Ga), and/or tin (Sn). For example, the semiconductor layer ACT may include an indium-gallium-zinc oxide (IGZO). The first region and the second region may be regions in which a semiconductor material is conductive on the semiconductor layer ACT.

The gate electrode GE may be disposed on the gate insulating layer GI, and may overlap the channel region of the semiconductor layer ACT.

The gate insulating layer GI may cover the semiconductor layer ACT, and may insulate the semiconductor layer ACT and the gate electrode GE. The first interlayer insulating layer ILD1 may cover the gate electrode GE.

The capacitor electrode CPE may be disposed on the first interlayer insulating layer ILD1. The capacitor electrode CPE may overlap the gate electrode GE. The capacitor electrode CPE and the gate electrode GE may constitute a capacitor. The second interlayer insulating layer ILD2 may cover the capacitor electrode CPE.

Each of the bottom metal layer BML, the gate electrode GE, and the capacitor electrode CPE may include molybdenum (Mo), aluminum (Al), copper (Cu), and/or titanium (Ti), etc. Each of the bottom metal layer BML may be a single layer or a multilayer. The first buffer layer BF1, the second buffer layer BF2, the gate insulating layer GI, the first interlayer insulating layer ILD1, and the second interlayer insulating layer ILD2 may include an inorganic insulating material such as a silicon nitride, a silicon oxide, and/or a silicon oxynitride, and may be a single layer or a multilayer.

The first connection electrode CNE1 may be disposed on the second interlayer insulating layer ILD2, and may be connected to the first region of the semiconductor layer ACT through contact holes formed in the gate insulating layer GI, the first interlayer insulating layer ILD1, and the second interlayer insulating layer ILD2. The first passivation layer PAS1 may cover the first connection electrode CNE1.

The second connection electrode CNE2 may be disposed on the first passivation layer PAS1, and may be connected to the first connection electrode CNE1 through a contact hole formed in the first passivation layer PAS1. The second passivation layer PAS2 may cover the second connection electrode CNE2.

Each of the first connection electrode CNE1 and the second connection electrode CNE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), etc., and may be a single layer or a multilayer. The first passivation layer PAS1 and the second passivation layer PAS2 may include an organic insulating material such as a general-purpose polymer such as poly(methyl methacrylate) or polystyrene, a polymer derivative having a phenol-based group, an acryl-based polymer, an imide-based polymer (e.g., a polyimide), an acryl-based polymer, and a siloxane-based polymer.

The light emitting element layer EEL may be disposed on the driving device layer DDL. The light emitting element layer EEL may include a light emitting element ED and a pixel defining layer PDL. The light emitting element ED may include a pixel electrode AE, an emission layer EL, and a common electrode CE. The light emitting element ED may further include a functional layer FL including at least one of a hole injection layer, a hole transport layer, an electron injection layer, and an electron transport layer. The functional layer FL may include a portion disposed between the pixel electrode AE and the emission layer EL and a portion disposed between the emission layer EL and the common electrode CE.

The pixel electrode AE may be disposed on the second passivation layer PAS2, and may be connected to the second connection electrode CNE2 through the contact hole formed in the second passivation layer PAS2. Hence, the pixel electrode AE may be electrically connected to the first region of the semiconductor layer ACT of the transistor TR, and may receive a driving current through the transistor TR. The pixel electrode AE may be made of a reflective conductive material or a semi-transmitting conductive material, or may be made of a transparent conductive material. The pixel electrode AE may include a transparent conductive material such as an indium tin oxide (ITO) and/or an indium zinc oxide (IZO). The pixel electrode AE may include metal such as lithium (Li), calcium (Ca), aluminum (Al), silver (Ag), magnesium (Mg), and/or gold (Au), or metal alloys thereof. The pixel electrode AE may be a multilayer. For example, it may have a triple-layered structure of ITO/silver (Ag)/ITO.

The emission layer EL may be disposed on the pixel electrode AE. For example, the emission layer EL may be an organic emission layer made of an organic material. The functional layer FL disposed between the emission layer EL and the pixel electrode AE may include the hole injection layer and/or the hole transport layer, and the functional layer FL disposed between the emission layer EL and the common electrode CE may include the electron transport layer and/or the electron injection layer.

The common electrode CE may be disposed on the emission layer EL. The common electrode CE may constitute a light emitting element ED such as an organic light emitting diode or an inorganic light emitting diode together with the pixel electrode AE and the emission layer EL. The pixel electrode AE may be an anode of the light emitting element ED, and the common electrode CE may be a cathode of the light emitting element ED. The common electrode CE may be made into a thin layer by using a metal or a metal alloy with a low work function such as calcium (Ca), barium (Ba), magnesium (Mg), aluminum (Al), and/or silver (Ag), thereby having visible light transmission. The common electrode CE may include a transparent conductive oxide such as an indium tin oxide (ITO) or an indium zinc oxide (IZO). A low-potential power voltage (or common voltage) may be applied to the common electrode CE.

The pixel defining layer PDL may be disposed on the second passivation layer PAS2, and may cover an edge of the pixel electrode AE. The pixel defining layer PDL may include the openings OPE1, OPE2, and OPE3 overlapping the pixel electrode AE. As described above, the openings OPE1, OPE2, and OPE3 of the pixel defining layer PDL may define first to third light emitting regions EA1, EA2, and EA3, and areas or sizes thereof may be different from each other. The pixel defining layer PDL may be a black pixel defining layer including a colored pigment such as a black pigment or a blue pigment. For example, the pixel defining layer PDL may include a polyimide binder and a pigment that is a mixture of red, green, and blue. For example, the pixel defining layer PDL may include a cardo binder resin and a mixture of a lactam black pigment and a blue pigment. The pixel defining layer PDL may include carbon black. The black pixel defining layer may improve the contrast ratio, and may prevent reflection caused by a metal layer disposed below the same.

The encapsulation layer TFE may be disposed on the common electrode CE and may cover the light emitting elements ED. The encapsulation layer TFE may encapsulate the light emitting element layer EEL to prevent permeation of moisture or oxygen from the outside. The encapsulation layer TFE may be a thin film encapsulation layer including at least one inorganic layer and at least one organic layer. For example, the encapsulation layer TFE may have a triple-layered structure of a first inorganic layer IL1, an organic layer OL, and a second inorganic layer IL2. The first inorganic layer IL1 may cover the common electrode CE, and may prevent permeation of moisture or oxygen into the light emitting elements ED. The organic layer OL may cover the surface curvature of the first inorganic layer IL1 or particles existing on the first inorganic layer IL1, and may block an influence of a surface state of the first inorganic layer IL1 to the components formed on the organic layer OL. The organic layer OL may ease stresses between the contacting layers.

The second inorganic layer IL2 may cover the organic layer OL. The second inorganic layer IL2 may prevent moisture from being discharged from the organic layer OL. The first inorganic layer IL1 and the second inorganic layer IL2 may include an inorganic material such as a silicon oxide, a silicon nitride, a silicon oxynitride, an aluminum oxide, a titanium oxide, a tantalum oxide, a hafnium oxide, and/or a zinc oxide. The organic layer OL may include an organic material such as an acryl-based resin, an epoxy-based resin, a polyimide, and/or a polyethylene.

The external light reducing layer CFL disposed on the encapsulation layer TFE may include a light blocker BM, color filters CF1, CF2, and CF3, and an overcoat layer OC.

The light blocker BM may be disposed on the encapsulation layer TFE. The light blocker BM may include openings OPT1, OPT2, and OPT3 overlapping the light emitting regions EA1, EA2, and EA3. The openings OPT1, OPT2, and OPT3 may have greater areas or sizes than the openings OPE1, OPE2, and OPE3, respectively, of the pixel defining layer PDL As the openings OPT1, OPT2, and OPT3 of the light blocker BM are greater than the openings OPE1, OPE2, and OPE3 of the pixel defining layer PDL, light emitted by the light emitting regions EA1, EA2, and EA3 may be discharged to a front direction and a lateral direction of the light emitting display device 30. The light blocker BM may include a light absorbing material. For example, the light blocker BM may include an inorganic black pigment or an organic black pigment. The inorganic black pigment may be carbon black, and the organic black pigment may include lactam black, perylene black, and/or aniline black. The light blocker BM may increase color reproducibility of the light emitting display device 30 by preventing visible rays from entering the first to third light emitting regions EA1, EA2, and EA3 and being color-mixed.

The color filters CF1, CF2, and CF3 may be disposed on the light blocker BM. The color filters CF1, CF2, and CF3 may correspond to the light emitting regions EA1, EA2, and EA3. For example, the first color filter CF1 may overlap the first opening OPE1 of the pixel defining layer PDL and the first opening OPT1 of the light blocker BM, the second color filter CF2 may overlap the second opening OPE2 of the pixel defining layer PDL and the second opening OPT2 of the light blocker BM, and the third color filter CF3 may overlap the third opening OPE3 of the pixel defining layer PDL and the third opening OPT3 of the light blocker BM. The color filters CF1, CF2, and CF3 may have greater areas than the openings OPT1, OPT2, and OPT3, respectively, of the light blocker BM, and some of the respective color filters CF1, CF2, and CF3 may overlap the light blocker BM. The overlapping portion SP on which the adjacent color filters CF1, CF2, and CF3 overlap each other may be disposed on the light blocker BM.

The overcoat layer OC may cover the color filters CF1, CF2, and CF3, and may planarize an upper side of the display panel 100. The overcoat layer OC may include a colorless and transparent organic material such as an acryl-based resin. The overcoat layer OC may have a different refractive index from the color filters CF1, CF2, and CF3. The refractive index of the overcoat layer OC may be less/greater than the refractive indices of the color filters CF1, CF2, and CF3. Hence, light may be refracted on a border between the overcoat layer OC and the color filters CF1, CF2, and CF3.

When the refractive index of the overcoat layer OC is less than the refractive indices of the color filters CF1, CF2, and CF3, the refractive index of the overcoat layer OC for the light with the wavelength of about 540 nm to about 590 nm may be equal to or less than about 1.5. The overcoat layer OC with a low-refractive index may include propylene glycol methyl ether acetate (PGMEA) or 3-methoxypropanoic acid methyl ester (MMP) as a main component, and may further include an acryl resin and a multifunctional acrylate. For example, the overcoat layer OC may include about 75 wt % to about 80 wt % of propylene glycol methyl ether acetate, about 10 wt % to about 15 wt % of a methacrylic acid-benzylmethacrylic acid copolymer, about 5 wt % to about 10 wt % of a multifunctional acrylate, and about 1 wt % to about 10 wt % of a photo initiator. The multifunctional acrylate may be dipentaerythritol hexaacrylate (DPHA). For example, the overcoat layer OC may include about 80 wt % to about 85 wt % of 3-3-methoxypropanoic acid methyl ester, about 5 wt % to about 10 wt % of a methacrylic acid-benzylmethacrylic acid copolymer, about 5 wt % to about 10 wt % of a multifunctional acrylate, and about 1 wt % to about 10 wt % of a photo initiator.

When external light is reflected by the display panel 100, it may be seen as a diffracted pattern. The color filters CF1, CF2, and CF3 may include recess portions RC formed on the upper side. The recess portions RC may be intaglio patterns formed in a region overlapping the openings OPT1, OPT2, and OPT3 of the light blocker BM and/or a region overlapping the openings OPE1, OPE2, and OPE3 of the pixel defining layer PDL in the color filters CF1, CF2, and CF3. The recess portions RC might not penetrate the color filters CF1, CF2, and CF3. The recess portions RC may have a dimple shape. The recess portions RC may have a circular shape in a plan view so as to prevent an optical path changed by the recess portion RC from focusing on a specific direction. The recess portions RC may have a substantially oval or circular shape in a plan view, and may have a polygonal shape with round vertexes in a plan view. The center of each of the recess portions RC may have the greatest depth. A width (diameter) of the respective recess portions RC may be equal to or less than about 15 μm, about 10 μm, or about 7 μm. For example, it may be about 2 μm to about 7 μm or about 3 μm to about 6 μm.

The overcoat layer OC may fill the recess portions RC of the color filters CF1, CF2, and CF3. Hence, the overcoat layer OC may include convex portions that correspond to the recess portions RC of the color filters CF1, CF2, and CF3. According to the refractive index difference between the color filters CF1, CF2, and CF3 and the overcoat layer OC and the irregularity of the border between the color filters CF1, CF2, and CF3 and the overcoat layer OC caused by the recess portions RC, incident light and reflected light may be scattered at the border between the color filters CF1, CF2, and CF3 and the overcoat layer OC, and diffraction of the reflected light may be reduced.

The scattering for reducing the diffraction of reflected light may be more efficient when the refractive index of the overcoat layer OC is less than the refractive indices of the color filters CF1, CF2, and CF3. Referring to FIG. 7, the left drawing shows a reflected image when the refractive indices of the red, green, and blue color filters are 1.66, 1.54, and 1.58 and the refractive index of the overcoat layer OC is 1.75, and the right drawing shows a reflected image when the refractive indices of the red, green, and blue color filters are 1.66, 1.54 and 1.58 and the refractive index of the overcoat layer OC is 1.44. Here, the refractive index may be a refractive index for light with the wavelength of about 540 nm to about 590 nm. The right drawing indicates that a relatively small refractive index of the overcoat layer OC shows a relatively vague ring shape and the diffraction is further reduced. It is also found from a simulation result that the scattering effect is increased and the diffraction is reduced as a ratio (depth/width) of the depth to the width of the recess portion RC increases, as area ratios of the recess portions RC increase on the color filters CF1, CF2, and CF3, and as refractive index differences between the overcoat layer OC and the color filters CF1, CF2, and CF3 increase. According to an embodiment, an excellent scattering effect may be generated when the area ratio of the recess portions RC is equal to or greater than about 50% in a region overlapping the openings OPT1, OPT2, and OPT3 of the light blocker BM on the color filters CF1, CF2, and CF3, the refractive index difference between the overcoat layer OC and the color filters CF1, CF2, and CF3 is equal to or greater than 0.05, and the depth of the recess portion RC is 0.5 μm±0.3 μm.

The color filters CF1, CF2, and CF3 may be formed by using a negative photoresist material. The recess portions RC may selectively irradiate light and develop the same by use of a slit mask or a halftone mask when the color filters CF1, CF2, and CF3 are formed.

Figure 8:
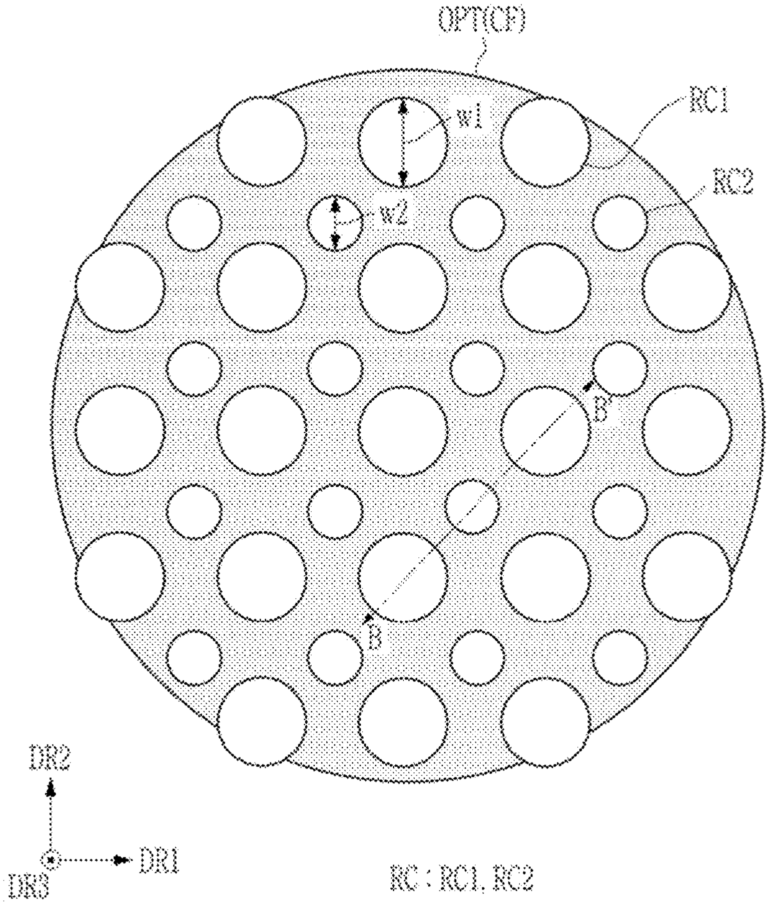
FIG. 8 is a top plan view of disposition of recess portions in a light emitting display device according to an embodiment.
Figure 9:
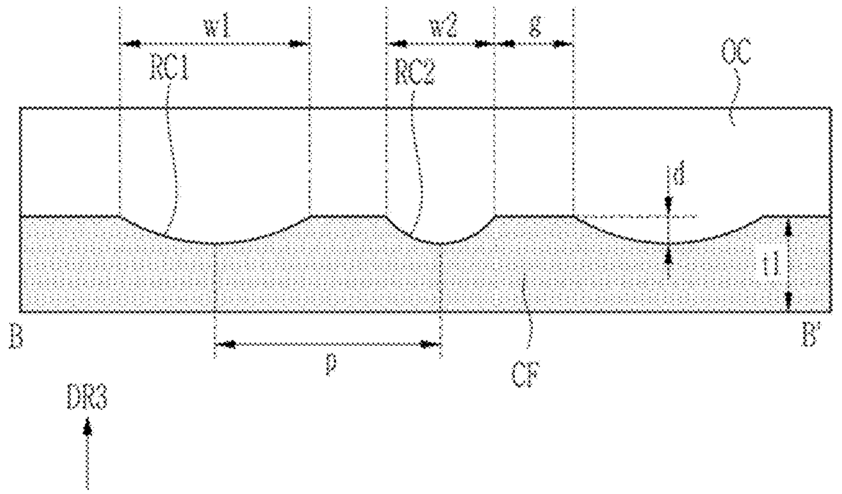
FIG. 9 is a cross-sectional view with respect to a line B-B' of FIG. 8.
Figure 10:
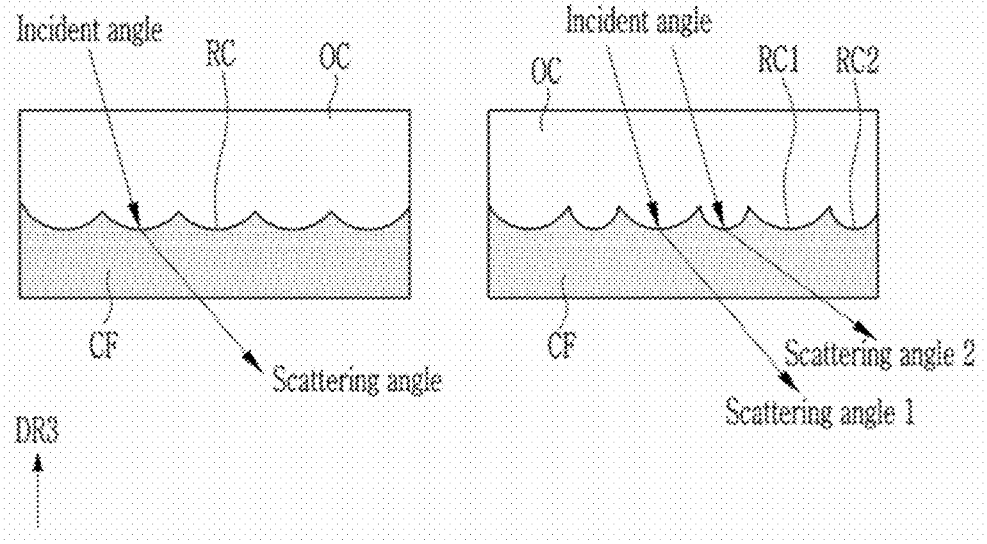
FIG. 10 is cross-sectional view illustrating scattering characteristics of a light emitting display device according to embodiments.

FIG. 8 is a top plan view of disposition of recess portions in a light emitting display device according to an embodiment, and FIG. 9 is a cross-sectional view with respect to a line B-B' of FIG. 8. FIG. 10 includes cross-sectional views illustrating scattering characteristics of a light emitting display device according to embodiments.

FIG. 8 and FIG. 9 show part of the external light reducing layer CFL on the display panel 100 according to an embodiment. The opening OPT and the color filter CF having a circular shape in a plan view may correspond to one opening and a color filter corresponding to the same from among the openings OPT1, OPT2, and OPT3 and the color filters CF1, CF2, and CF3 of the above-described light blocker BM. The color filter CF may include the recess portions RC on the upper side, and the overcoat layer OC may be disposed on the color filter CF.

The recess portion RC may have a dimple shape and may have a circular shape in a plan view. The recess portion RC may have a substantially oval or circular shape in a plan view. The recess portions RC may include a first recess portion RC1 and a second recess portion RC2 with different widths (e.g., where the widths correspond to diameters). The first recess portion RC1 may have a first width w1, and the second recess portion RC2 may have a second width w2 that is less than the first width w1. The first width w1 may be equal to or greater than about 4 μm or may be equal to or greater than about 5 μm. For example, the first width w1 may be about 5 μm to about 7 μm. The second width w2 may be equal to or less than about 4 μm or may be equal to or less than about 3 μm. For example, the second width w2 may be about 2 μm to about 4 μm. For example, the first width w1 may be about 5 μm, and the second width w2 may be about 3 μm. The depth d of each of the first recess portion RC1 and the second recess portion RC2 may be about 0.2 μm to about 0.8 μm. For example, the depth d of each of the first recess portion RC1 and the second recess portion RC2 may be about 0.5 μm. The first recess portion RC1 and the second recess portion RC2 may have the same depth d or may have different depths d. The thickness t of the color filter CF may be about 2.4 μm to about 3 μm. For example, the thickness t may be about 2.7 μm.

The first recess portions RC1 may be arranged in the first direction DR1 and the second direction DR2, and the second recess portions RC2 may be arranged in the first direction DR1 and the second direction DR2. The first recess portions RC1 and the second recess portions RC2 may be alternately disposed in an oblique direction between the first direction DR1 and the second direction DR2. The distance p between the centers of the adjacent first recess portion RC1 and the second recess portion RC2 may be about 0.3 μm to about 0.7 μm. For example, the distance p may be about 5.0 μm. A gap g between the adjacent first recess portion RC1 and the second recess portion RC2 may be about 0 μm to about 0.3 μm. For example, the gap g may be about 1.0 μm. The first recess portions RC1 and the second recess portions RC2 are shown to be regularly arranged, and may also be irregularly or randomly arranged. The recess portions RC may further include recess portions having a width or widths that is/are different from the first width w1 and the second width w2.

Referring to FIG. 10, the left drawing shows scattering characteristics of the light emitting display device in which the recess portions RC of the color filter CF have the same width, and the right drawing shows scattering characteristics of the light emitting display device in which the recess portions RC of the color filter CF include the first and second recess portions RC1 and RC2 with different widths. The first and second recess portions RC1 and RC2 with different widths may have concave portions with different curvatures. For example, the first recess portion RC1 may have less curvature than the second recess portion RC2. Therefore, regarding the light with the same incident angle, the first and second recess portions RC1 and RC2 with different widths may refract light with various scattering angles and may form various optical paths, compared to the recess portions RC with a single width. Accordingly, the first and second recess portions RC1 and RC2 with different widths formed on the color filter CF may increase the scattering effect more than the recess portions RC with a single width.

Figure 11:
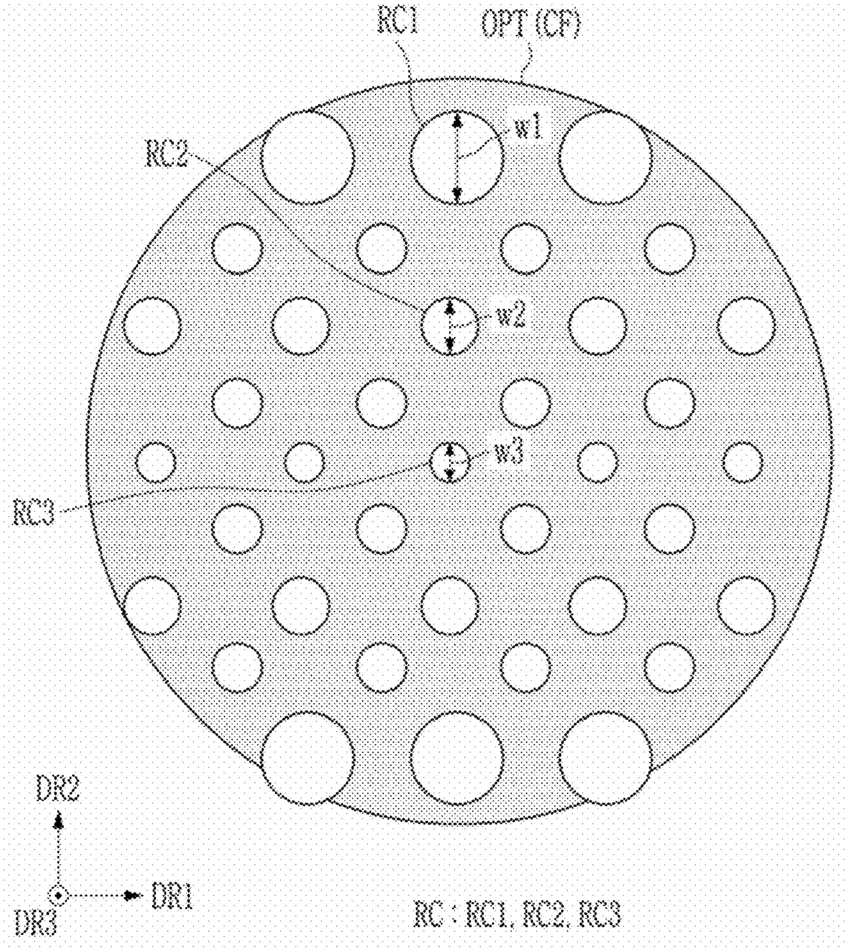
FIG. 11 is a top plan view illustrating a disposition of recess portions in a light emitting display device according to an embodiment.

FIG. 11 is a top plan view of disposition of recess portions in a light emitting display device according to an embodiment.

The embodiment shown in FIG. 11 is different from the embodiment shown in FIG. 8 in the disposition of the recess portions RC formed in the color filter CF. The respective recess portions RC may have a dimple shape, or may have a circular shape in a plan view. The respective recess portions RC may have a substantially oval or circular shape in a plan view, and may have a polygonal shape with round vertexes in a plan view. The recess portions RC may include a first recess portion RC1, a second recess portion RC2, and a third recess portion RC3 with different widths. The first recess portion RC1 may have a first width w1, the second recess portion RC2 may have a second width w2 that is less than the first width w1, and the third recess portion RC3 may have a third width w3 that is less than the second width w2. The first width w1 may be equal to or greater than about 4 μm or may be equal to or greater than about 5 μm. For example, the first width w1 may be about 5 μm to about 7 μm. The second width w2 may be equal to or less than about 4 μm or may be equal to or less than about 3 μm. For example, the second width w2 may be about 2 μm to about 4 μm. The third width w3 may be equal to or less than about 3 μm or may be equal to or less than about 2 μm. For example, the third width w3 may be about 0.5 μm to about 1.5 μm. For example, the first width w1 may be about 5 μm, the second width w2 may be about 3 μm, and the third width w3 may be about 1 μm. The depth of each of the first recess portion RC1, the second recess portion RC2, and the third recess portion RC3 may be about 0.2 μm to about 0.8 μm.

For example, the depth of each of the first recess portion RC1, the second recess portion RC2, and the third recess portion RC3 may be about 0.5 μm. The first recess portion RC1, the second recess portion RC2, and the third recess portion RC3 may have the same depth, and at least two thereof may have different depths. The first, second, and third recess portions RC1, RC2, and RC3 with different widths may have concave portions with different curvatures. For example, the first recess portion RC1 may have less curvature than the second recess portion RC2, and the second recess portion RC2 may have less curvature than the third recess portion RC3.

The first recess portion RC1, the second recess portion RC2, and the third recess portion RC3 may have various dispositions and ratios. The recess portions RC may be disposed so that the sizes of the recess portions RC may increase when approaching the outside from the center of the region limited by the opening OPT of the light blocker BM. For example, the first recess portion RC1 may be disposed on the outside, the third recess portion RC3 may be disposed in the center, and the second recess portion RC2 may be disposed between the first recess portion RC1 and the third recess portion RC3. The first recess portion RC1, the second recess portion RC2, and the third recess portion RC3 may be regularly arranged, or may be irregularly or seemingly randomly arranged. The recess portions RC may further include recess portions with a width or widths that Is/are different from the first width w1, the second width w2, or the third width w3.

Figure 12:
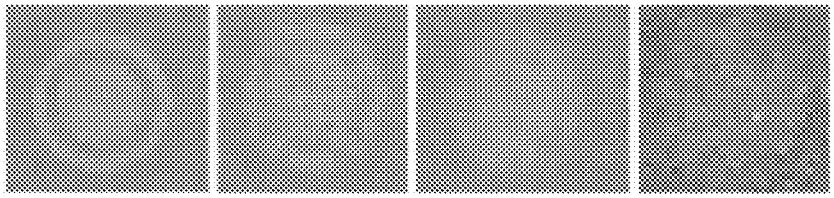
FIG. 12 are images illustrating reflecting characteristics of a light emitting display device according to a comparative example and several embodiments.

FIG. 12 includes images illustrating reflecting characteristics of a light emitting display device according to a comparative example and several embodiments.

Referring to FIG. 12, starting from the left, the first drawing shows a reflected image according to a comparative example in which no pattern such as the recess portion is formed on the color filter, the second drawing shows a reflected image according to an embodiment in which recess portions with the width of 5.0 μm are formed in the color filter, the third drawing shows a reflected image according to an embodiment in which recess portions with the width of 5.0 μm and recess portions with the width of 3.0 μm are formed in the color filter, and the fourth drawing shows a reflected image according to an embodiment in which recess portions with the width of 5.0 μm, recess portions with the width of 3.0 μm, and recess portions with the width of 1.0 μm are formed in the color filter. In the respective embodiments, the recess portions are regularly disposed, and the adjacent recess portions contact each other.

As shown, the ring shape is clearly visible according to a comparative example in which no pattern is formed. The ring shape is vaguely shown in an embodiment in which the recess portions with a single width are formed, the ring shape is vaguely shown in an embodiment in which the recess portions with two widths are formed, and it is difficult to distinguish the ring shape in an embodiment in which the recess portions with three widths are formed. It is found from the above-noted result that the characteristic of reflecting external light may be increased by forming the pattern of recess portions on the upper side of the color filter and thereby increasing the scattering, and the scattering may be further increased and the characteristic of reflecting external light may be further increased by forming the recess portions with different widths. It is also found that the scattering effect is increased in an embodiment in which the recess portions with three widths are formed more than in an embodiment in which the recess portions with two widths are formed. The scattering effect is not significantly increased when the recess portions with four or more widths are formed, and optimal effects are obtained when the recess portions with three widths are formed.

FIG. 13, FIG. 14, FIG. 15, and FIG. 16 are cross-sectional views of a light emitting display device according to an embodiment.

Figure 13:
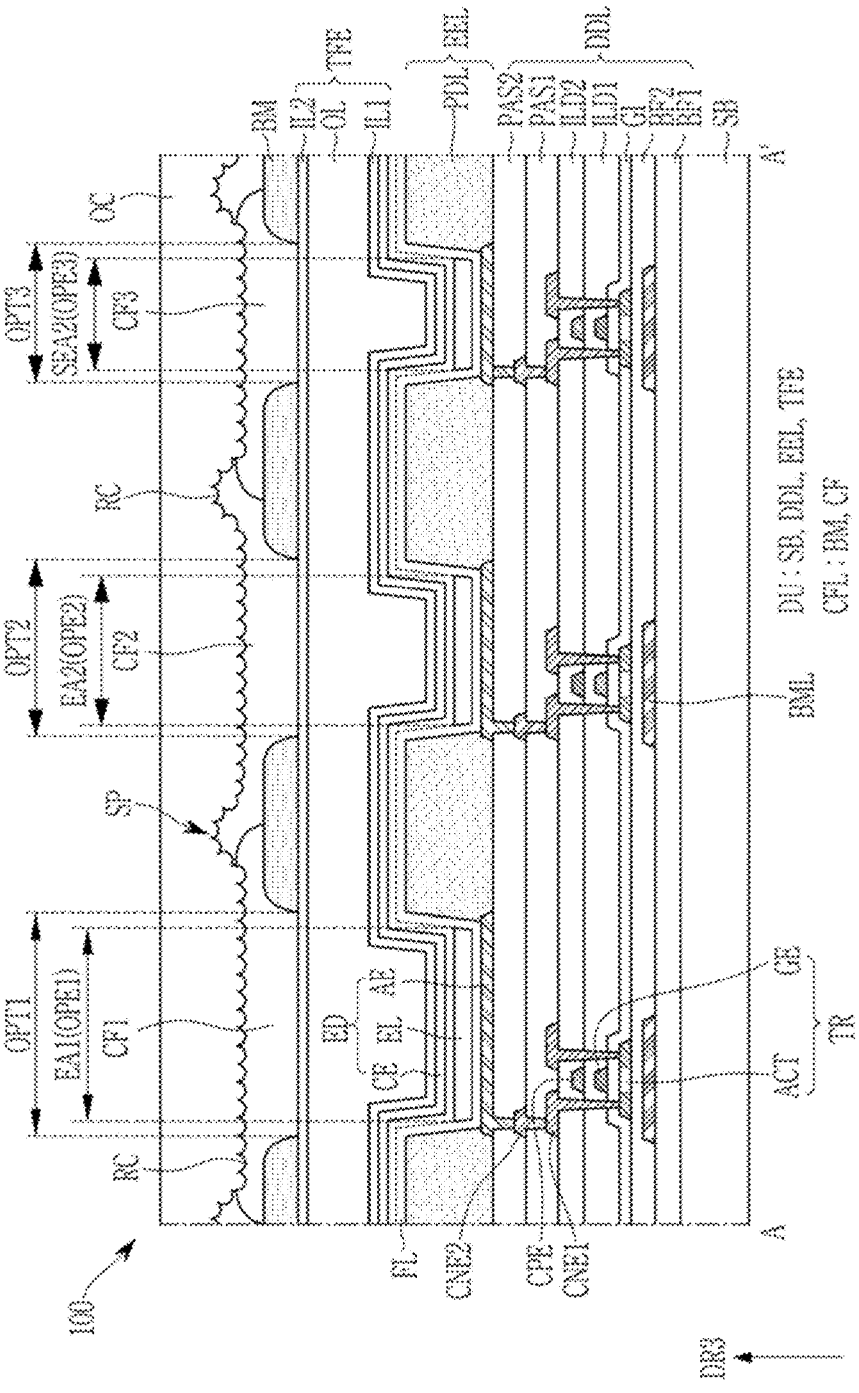
FIG. 13, FIG. 14, FIG. 15, and FIG. 16 are cross-sectional views of a light emitting display device according to an embodiment.

Referring to FIG. 13, the shown cross-section may correspond to the cross-section given with line A-A' of FIG. 5. The embodiment shown in FIG. 13 is different from the embodiment shown in FIG. 6 in the position of forming the recess portions RC. The recess portions RC may be formed in a region that overlaps the openings OPT1, OPT2, and OPT3 of the light blocker BM on the color filters CF1, CF2, and CF3 and may also be formed in a region that does not overlap the same. They may be formed on the upper side of the color filter disposed above the overlapping color filters on the overlapping portion SP of the adjacent color filters CF1, CF2, and CF3. The recess portions RC may include recess portions RC with different widths. For example, they may include first and second recess portions RC1 and RC2 as described in the embodiment of FIG. 8, or they may include first, second, and third recess portions RC1, RC2, and RC3 as described in the embodiment of FIG. 11. The recess portions RC formed on the overlapping portion SP may have the same size. When the recess portions RC are formed in the region not overlapping the openings OPT1, OPT2, and OPT3 of the light blocker BM, the scattering of external light input or reflected to sides of the light emitting regions EA1, EA2, and EA3 may be increased, and the diffraction of reflected light may be reduced.

Figure 14:
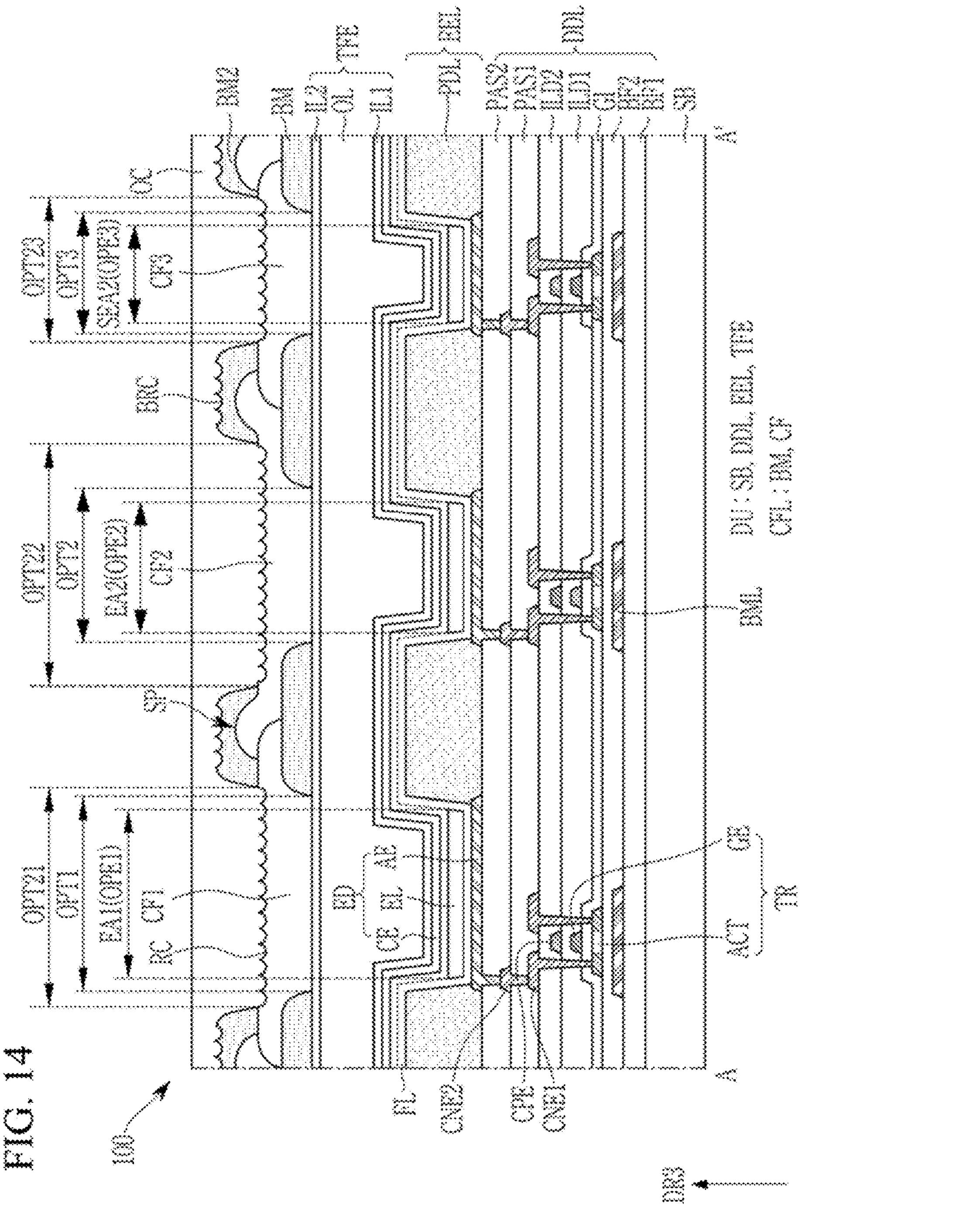

Referring to FIG. 14, the shown cross-section may correspond to the cross-section with respect to line A-A' of FIG. 5. Compared to the embodiment of FIG. 6, regarding the embodiment of FIG. 14, the display panel 100 may further include an upper light blocker BM2 disposed on the overlapping portion SP of the color filters CF1, CF2, and CF3. The upper light blocker BM2 may cover the overlapping portion SP of the color filters CF1, CF2, and CF3 to reduce scattering and reflection of external light from the overlapping portion SP, thereby reducing the visibility of reflection and diffraction. Openings OPT21, OPT22, and OPT23 may be formed on the upper light blocker BM2. The openings OPT21, OPT22, and OPT23 of the upper light blocker BM2 may overlap the openings OPT1, OPT2, and OPT3 of the light blocker BM and the openings OPE1, OPE2, and OPE3 of the pixel defining layer PDL, and may form a light outputting region for outputting light emitted by the light emitting regions EA1, EA2, and EA3. The openings OPT21, OPT22, and OPT23 of the upper light blocker BM2 may have a larger area than the corresponding openings OPT1, OPT2, and OPT3 of the light blocker BM, and the corresponding openings OPT1, OPT2, and OPT3 of the light blocker BM may be disposed in the openings OPT21, OPT22, and OPT23 of the upper light blocker BM2 when viewed from a plan view.

The upper light blocker BM2 may include a light absorbing material. For example, the upper light blocker BM2 may include an inorganic black pigment such as carbon black, or an organic black pigment such as lactam black, perylene black, or aniline black. The upper light blocker BM2 may increase color reproducibility of the light emitting display device 30 by preventing visible rays from entering the first, second, and third light emitting regions EA1, EA2, and EA3 and being color-mixed.

The upper light blocker BM2 may include recess portions BRC formed on the upper side. Similar to the recess portions RC formed in the color filters CF1, CF2, and CF3, the respective recess portion BRC may have a dimple shape, and may have a circular shape, an oval shape, or a substantially circular shape in a plan view. The recess portions BRC may include recess portions BRC with different widths. The recess portions BRC may have the same size. According to the refractive index difference between the upper light blocker BM2 and the overcoat layer OC and the irregularity of the border between the upper light blocker BM2 and the overcoat layer OC caused by the recess portions BRC, incident light and reflected light may be scattered at the border between the upper light blocker BM2 and the overcoat layer OC, and the diffraction of the reflected light may be reduced.

Figure 15:
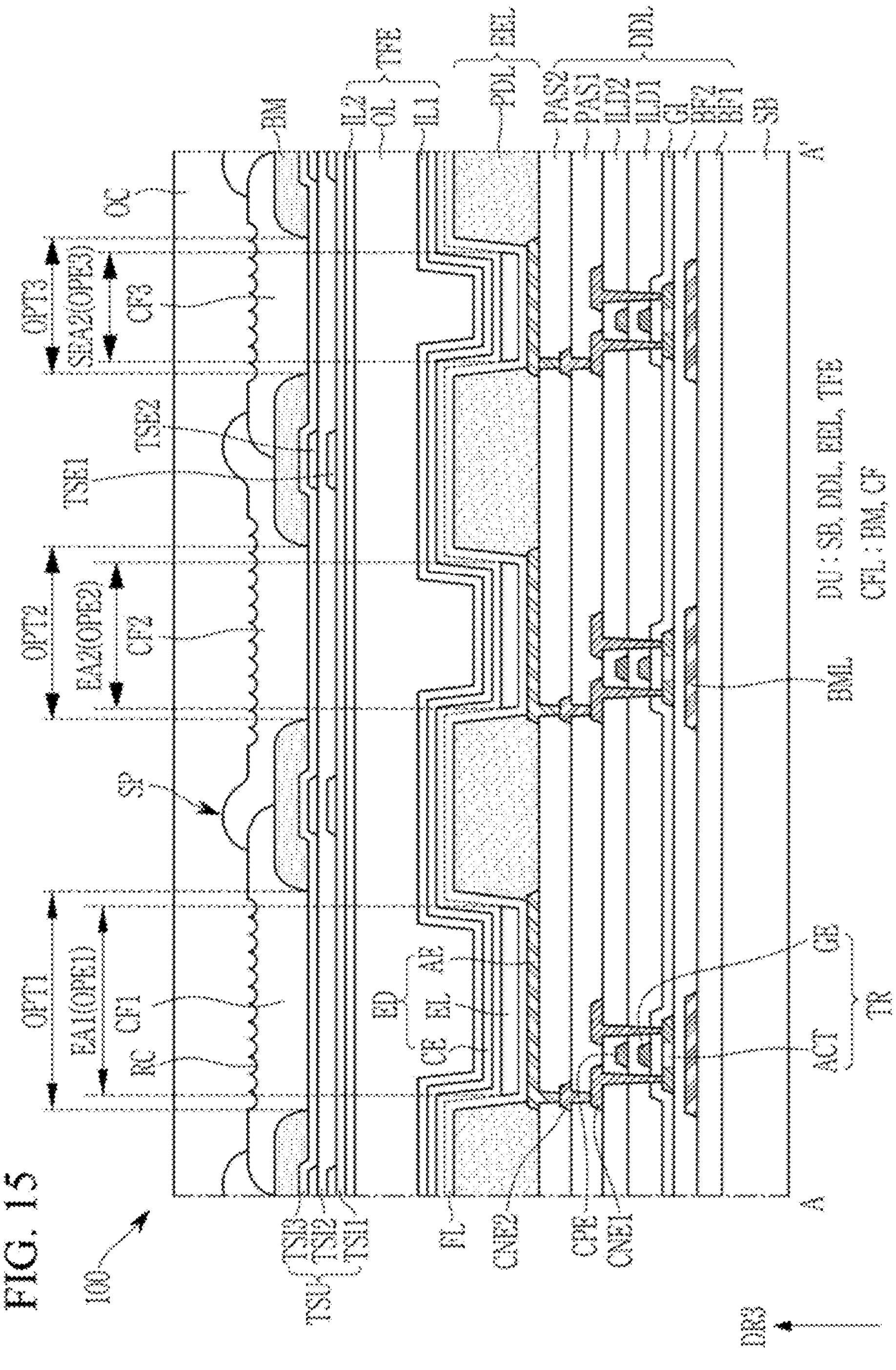

Referring to FIG. 15, the display panel 100 may include a touch sensor TSU for sensing touches. The touch sensor TSU may be disposed between the encapsulation layer TFE and the external light reducing layer CFL. Structures other than the touch sensor TSU may correspond to the embodiment of FIG. 6.

The touch sensor TSU may include sensing electrodes TSE1 and TSE2 disposed between the encapsulation layer TFE and the light blocker BM and overlapping the light blocker BM, and insulating layers TSI1, TSI2, and TSI3 disposed on at least one side of the sensing electrodes TSE1 and TSE2. The sensing electrodes TSE1 and TSE2 may be insulated with the insulating layer TSI2 therebetween, and some thereof may be electrically connected through the contact hole formed in the insulating layer TSI2. The light blocker BM may overlap the sensing electrodes TSE1 and TSE2, and may prevent reflection of external light caused by the sensing electrodes TSE1 and TSE2. The sensing electrodes TSE1 and TSE2 may be electrically connected to the touch driver 400 of the light emitting display device 30 shown in FIG. 2. The touch driver 400 may supply a touch driving signal to the sensing electrodes TSE1 and TSE2, and may sense a variance of capacitance between the sensing electrodes TSE1 and TSE2. The sensing electrodes TSE1 and TSE2 may include a metal such as aluminum (Al), copper (Cu), silver (Ag), gold (Au), molybdenum (Mo), titanium (Ti), and/or tantalum (Ta), or metal alloys thereof, and may be a single layer or a multilayer. The insulating layers TSI1, TSI2, and TSI3 may include an inorganic insulating material and/or an organic insulating material.

Figure 16:
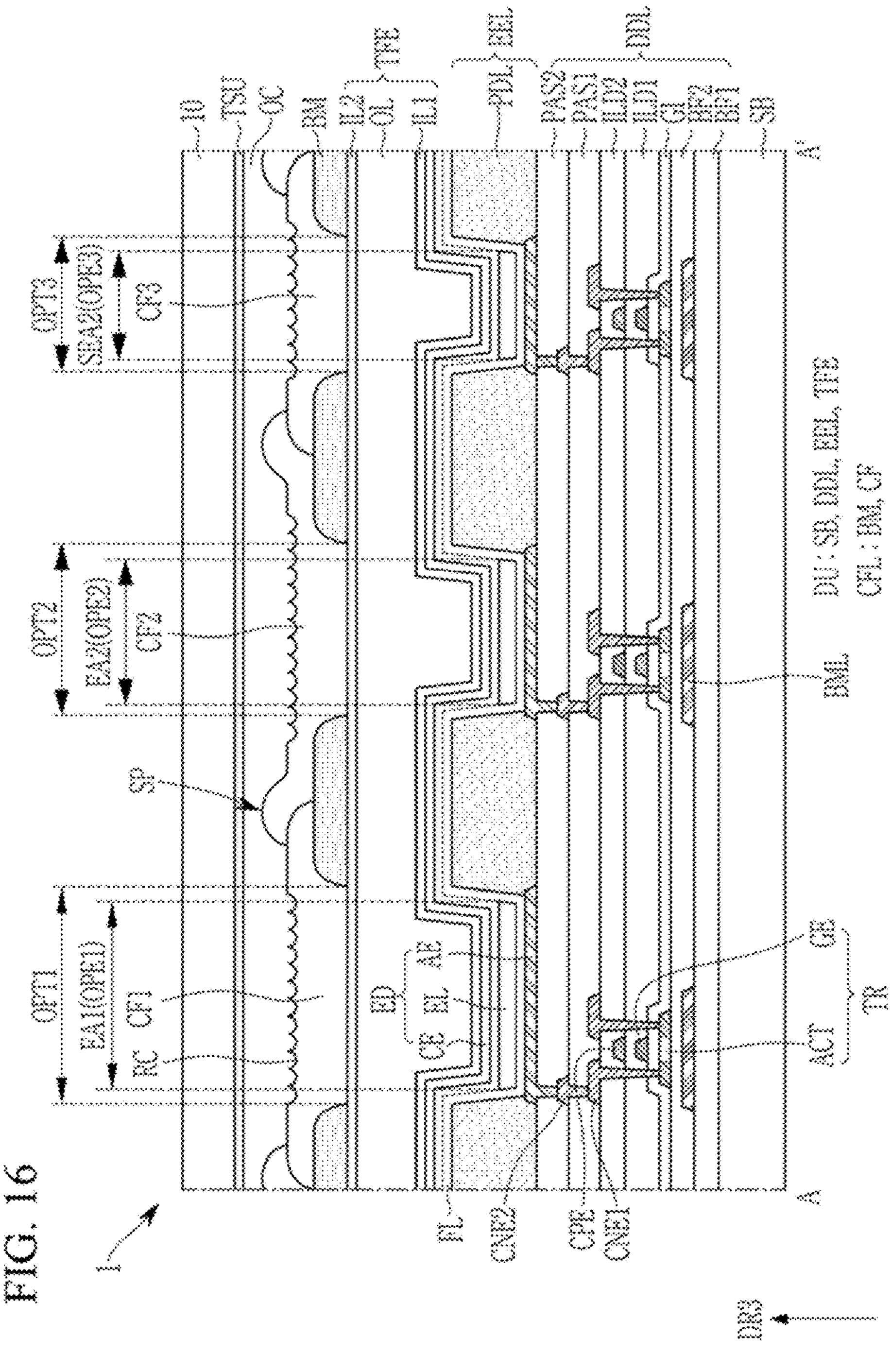

Referring to FIG. 16, a cover window 10 may be disposed on the overcoat layer OC of the display panel 100. The cover window 10 may cover the display panel 100 and may protect the display panel 100 from external impacts. The cover window 10 may be attached to the display panel 100 by an adhesive such as an optically clear adhesive. The touch sensor TSU may be disposed between the overcoat layer OC and the cover window 10. The touch sensor TSU may be disposed on the position that is different from what is shown—for example, a space between the encapsulation layer TFE and the color filters CF1, CF2, and CF3 as shown in the embodiment of FIG. 15.

While this disclosure has been described in connection with what is presently considered to be practical embodiments, it should be understood that the disclosure is not necessarily limited to the disclosed embodiments, but, on the contrary, is intended to cover various modifications and equivalent arrangements included within the spirit and scope of the present disclosure.

What is claimed is:

1. A light emitting display device, comprising:
- a substrate;
- a pixel electrode disposed on the substrate;
- a pixel defining layer including an opening overlapping the pixel electrode;
- a common electrode disposed on both the pixel electrode and the pixel defining layer;
- an encapsulation layer disposed on the common electrode; and
- a color filter disposed on the encapsulation layer,
- wherein the color filter includes recess portions formed on an upper side thereof and corresponds to a single light emitting region defined by the opening,
- wherein the recess portions include a first recess portion having a first width and a second recess portion having a second width that is different from the first width, and
- wherein the first recess portion and the second recess portion overlap the single light emitting region.

2. The light emitting display device of claim 1, wherein the first width is within a range of 5 μm to 7 μm, and the second width is within a range of 2 μm to 4 μm.

3. The light emitting display device of claim 1, wherein the first recess portion and the second recess portion each have a depth within a range of 0.2 μm to 0.8 μm.

4. The light emitting display device of claim 1, wherein the first recess portion has less curvature than the second recess portion.

5. The light emitting display device of claim 1, wherein the recess portions are formed in a region overlapping at least the opening.

6. The light emitting display device of claim 1, further comprising:
- an overcoat layer disposed on the color filter, and
- a light blocker disposed between the color filter and the overcoat layer and having an opening overlapping the opening of the pixel defining layer,
- wherein the light blocker includes a recess portion formed on the upper side thereof.

7. The light emitting display device of claim 1, wherein the recess portions further include a third recess portion having a third width that is different from each of the first width and the second width.

8. The light emitting display device of claim 7, wherein the first width is within a range of 5 μm to 7 μm, the second width is within a range of 2 μm to 4 μm, and the third width is within a range of 0.5 μm to 1.5 μm.

9. The light emitting display device of claim 1, further comprising
- an overcoat layer disposed on the color filter,
- wherein a refractive index difference between the color filter and the overcoat layer is 0.05 or more.

10. The light emitting display device of claim 1, further comprising
- a light blocker disposed between the encapsulation layer and the color filter, and having an opening overlapping the opening of the pixel defining layer,
- wherein the recess portions are formed in a region overlapping the opening of the light blocker on the color filter.

11. The light emitting display device of claim 1, wherein at least some of the recess portions contact each other.

12. The light emitting display device of claim 1, wherein each of the recess portions has a dimple shape.

13. A light emitting display device, comprising:
a substrate;
a pixel electrode disposed on the substrate;
a pixel defining layer including an opening overlapping the pixel electrode;
a common electrode disposed on both the pixel electrode and the pixel defining layer;
an encapsulation layer disposed on the common electrode; and
color filters disposed on the encapsulation layer,
wherein the color filters include recess portions formed on an upper side thereof,
wherein the recess portions include a first recess portion having a first width and a second recess portion having a second width that is different from the first width,
wherein the color filters include a first color filter and a second color filter that are adjacent to each other,
wherein edge portions of the first color filter and the second color filter overlap each other to form an overlapping portion, and
wherein the recess portions include an overlapping recess portion disposed on an upper side of the overlapping portion.

14. An electronic device, comprising:
a housing;
a cover window disposed on the housing; and
a display panel disposed between the housing and the cover window,
wherein the display panel includes:
a substrate;
a pixel electrode disposed on the substrate;
a pixel defining layer including an opening overlapping the pixel electrode;
a common electrode disposed on both the pixel electrode and the pixel defining layer;
an encapsulation layer disposed on the common electrode; and
a color filter disposed on the encapsulation layer,
wherein the color filter includes recess portions formed on the upper side thereof and corresponds to a single light emitting region defined by the opening,
wherein the recess portions include a first recess portion having a first width and a second recess portion having a second width that is different from the first width, and
wherein the first recess portion and the second recess portion overlap the single light emitting region.

15. The electronic device of claim 14, wherein
the first width is within a range from 5 μm to 7 μm, and the second width is within a range from 2 μm to 4 μm, and
the first recess portion and the second recess portion each have a depth within a range of 0.2 μm to 0.8 μm.

16. The electronic device of claim 14, wherein
the display panel further includes a light blocker disposed between the encapsulation layer and the color filter, and including an opening overlapping the opening of the pixel defining layer, and
the recess portions are formed in a region overlapping the opening of the light blocker on the color filter.

17. The electronic device of claim 14, wherein
the color filter includes a first color filter and a second color filter that are adjacent to each other,
edge portions of the first color filter and the second color filter overlap each other to form an overlapping portion, and
the recess portions include an overlapping recess portion disposed on an upper side of the overlapping portion.

18. The electronic device of claim 14, wherein
the display panel further includes:
an overcoat layer disposed on the color filter; and
a light blocker disposed between the color filter and the overcoat layer and including an opening overlapping the opening of the pixel defining layer, and
the light blocker includes a recess portion formed on an upper side thereof.

19. The electronic device of claim 14, wherein
the recess portions further include a third recess portion having a third width that is less than the second width.

20. The electronic device of claim 14, wherein
the display panel further includes an overcoat layer disposed on the color filter, and
a refractive index difference between the color filter and the overcoat layer is 0.05 or more.

* * * * *